(12) United States Patent
Ohtake et al.

(10) Patent No.: US 9,991,006 B2
(45) Date of Patent: Jun. 5, 2018

(54) ASYNCHRONOUS MEMORY ELEMENT FOR SCANNING

(71) Applicant: NATIONAL UNIVERSITY CORPORATION NARA INSTITUTE OF SCIENCE AND TECHNOLOGY, Ikoma (JP)

(72) Inventors: Satoshi Ohtake, Oita (JP); Hiroshi Iwata, Nara (JP); Michiko Inoue, Nara (JP)

(73) Assignee: National University Corporation Nara Institute Of Science and Technology, Ikoma (JP)

( * ) Notice: Subject to any disclaimer, the term of this patent is extended or adjusted under 35 U.S.C. 154(b) by 1254 days.

(21) Appl. No.: 13/715,929

(22) Filed: Dec. 14, 2012

(65) Prior Publication Data

US 2013/0103993 A1 Apr. 25, 2013

Related U.S. Application Data

(63) Continuation of application No. PCT/JP2011/003405, filed on Jun. 15, 2011.

(30) Foreign Application Priority Data

Jun. 17, 2010 (JP) .................................. 2010-138609

(51) Int. Cl.
  *G01R 31/28* (2006.01)
  *G11C 29/10* (2006.01)
  *G01R 31/3185* (2006.01)

(52) U.S. Cl.
  CPC ...... *G11C 29/10* (2013.01); *G01R 31/318536* (2013.01); *G01R 31/318541* (2013.01);
  (Continued)

(58) Field of Classification Search
  CPC .... G01R 31/318536; G01R 31/318541; G01R 31/318572; G01R 31/318533;
  (Continued)

(56) References Cited

U.S. PATENT DOCUMENTS 5,406,216 A * 4/1995 Millman .............. H03K 3/0375
                                                       327/107
5,838,693 A * 11/1998 Morley .......... G01R 31/318586
                                                       714/726

(Continued)

FOREIGN PATENT DOCUMENTS

JP       07-202645 A     8/1995
JP       2004-521352 A   7/2004
(Continued)

OTHER PUBLICATIONS

Khoche, A. et al., A partial scan methodology for testing self-time circuits, Proceedings of the 13th IEEE VLSI Test Symposium, 1995, 283-289.

(Continued)

*Primary Examiner* — Albert Decady
*Assistant Examiner* — Osman M Alshack
(74) *Attorney, Agent, or Firm* — Knobbe, Martens, Olson & Bear, LLP

(57) ABSTRACT

A scan asynchronous memory element includes: an asynchronous memory element configured to receive an n-input; and a scan control logic circuit configured to generate an n-bit signal input and the n-input to the asynchronous memory element from a scan input. The scan control logic circuit outputs the signal input when a control signal supplied to the scan control logic circuit has a first bit pattern, the scan control logic circuit outputs the scan input when the control signal has a second bit pattern, and the scan control logic circuit outputs a bit pattern allowing the asynchronous (Continued)

memory element to hold a previous value when the control signal has a bit pattern other than the first and second bit patterns.

13 Claims, 13 Drawing Sheets

(52) U.S. Cl.
CPC ............... *G01R 31/318544* (2013.01); *G01R 31/318555* (2013.01)

(58) Field of Classification Search
CPC ...... G01R 31/318544; G01R 31/31813; G01R 31/318307; G01R 31/31921; G01R 31/318371; G01R 31/318555; G06F 11/263; G11C 29/10
USPC ............................ 714/726, 738, 720; 326/16
See application file for complete search history.

(56) References Cited

U.S. PATENT DOCUMENTS

| | | | | |
|---|---|---|---|---|
| 6,023,430 | A * | 2/2000 | Izumikawa | G11C 7/22 365/189.04 |
| 6,052,770 | A * | 4/2000 | Fant | G06F 5/08 708/232 |
| 6,152,613 | A * | 11/2000 | Martin | G06F 9/3871 712/33 |
| 6,401,005 | B1 * | 6/2002 | Schwarz | G05B 19/4093 700/159 |
| 6,442,722 | B1 * | 8/2002 | Nadeau-Dostie | G01R 31/318552 714/729 |
| 6,918,074 | B2 * | 7/2005 | Kim | G06F 11/267 714/726 |
| 7,418,676 | B2 * | 8/2008 | Karaki | G06F 17/5059 716/103 |
| 7,444,564 | B2 * | 10/2008 | Anand | G11C 29/14 714/723 |
| 7,710,159 | B2 * | 5/2010 | Shinde | H03K 19/01707 326/115 |
| 8,171,330 | B2 * | 5/2012 | Renaudin | H03K 19/00323 713/401 |
| 8,589,611 | B2 * | 11/2013 | Tanaka | G06F 13/362 709/221 |
| 9,355,690 | B1 * | 5/2016 | Tuan | G11C 7/1039 |
| 2005/0076275 | A1 * | 4/2005 | Van Berkel | G01R 31/318541 714/724 |
| 2006/0168416 | A1 * | 7/2006 | Kessels | G06F 13/1642 711/167 |
| 2007/0011529 | A1 * | 1/2007 | Takasuka | G01R 31/318572 714/727 |
| 2007/0168688 | A1 * | 7/2007 | Chelstrom | G06F 1/04 713/503 |
| 2008/0288837 | A1 * | 11/2008 | Peeters | G01R 31/318533 714/726 |
| 2009/0009182 | A1 * | 1/2009 | Bainbridge | G01R 31/31725 324/537 |
| 2009/0307516 | A1 * | 12/2009 | Renaudin | H03K 19/00323 713/401 |
| 2010/0185909 | A1 * | 7/2010 | Li | G01B 31/318541 714/726 |

FOREIGN PATENT DOCUMENTS

| | | |
|---|---|---|
| WO | 2006/013524 A1 | 2/2006 |
| WO | 20101001187 A1 | 1/2010 |

OTHER PUBLICATIONS

Kondratyev, A. et al., Testing of asynchronous designs by "inappropriate" means, Synchronous approach, Proceedings of the Eighth IEEE International Sysmposium on Asynchronous Circuits and Systems, 2002, 171-180.

Te Beest, F. et al., A multiplexer based test method for self-timed circuits, Proceedings of the 11th IEEE International Sysmposium on Asynchronous Circuits and Systems, 2005.

Te Beest, F. et al., Synchronous full-scan for asynchronous handshake circuits, Journal of Electronic Testing, 2003, 397-406, 19, The Netherlands.

Van Berkel, K. et al., Adding synchronous and LSSD modes to asynchronous circuits, Microprocessors and Microsystems, 2003, 461-471, vol. 27.

Te Beest, F. et al., Automatic scan insertion and test generation for asynchronous circuits, ITC International Test Conference, 2002, 804-813.

* cited by examiner

FIG.6A
ORIGINAL ASYNCHRONOUS CIRCUIT
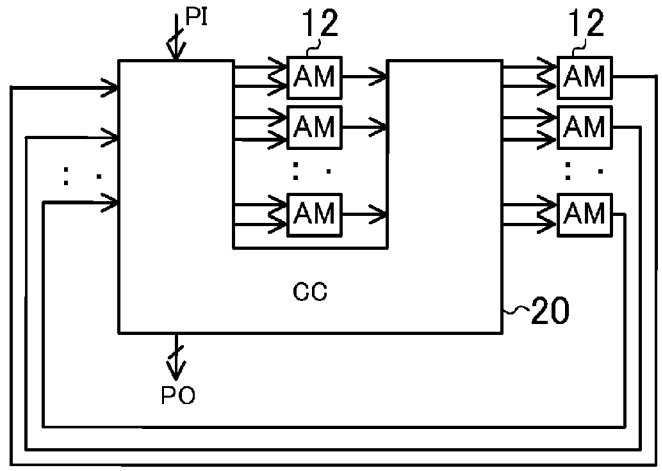
⇩ STEP 1: REPLACE ASYNCHRONOUS MEMORY ELEMENTS (AM) WITH SCAN ASYNCHRONOUS MEMORY ELEMENTS (SAM)
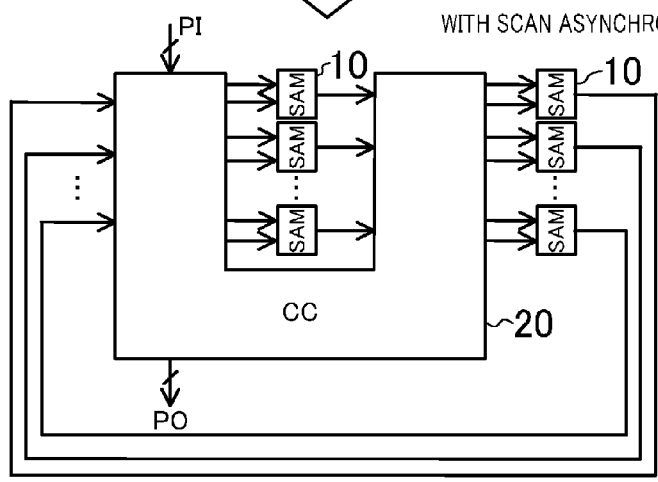
⇩ STEP 2: DIVIDE COMBINATIONAL CIRCUIT
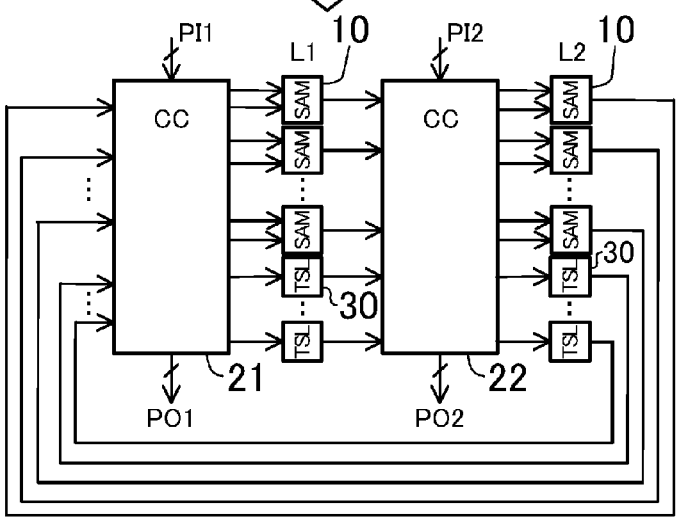

FIG.6B
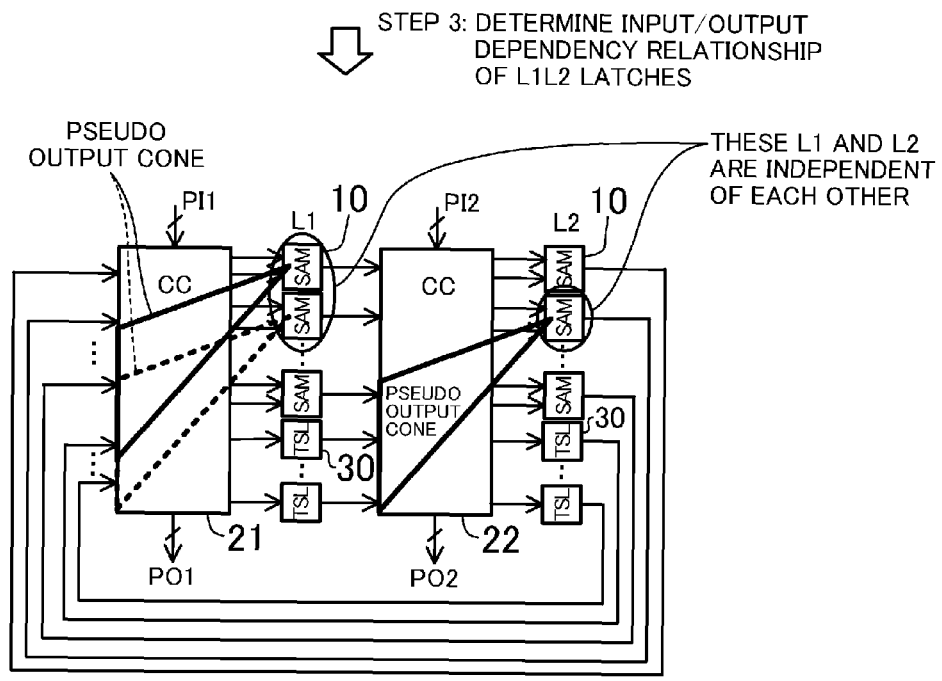
STEP 3: DETERMINE INPUT/OUTPUT DEPENDENCY RELATIONSHIP OF L1L2 LATCHES
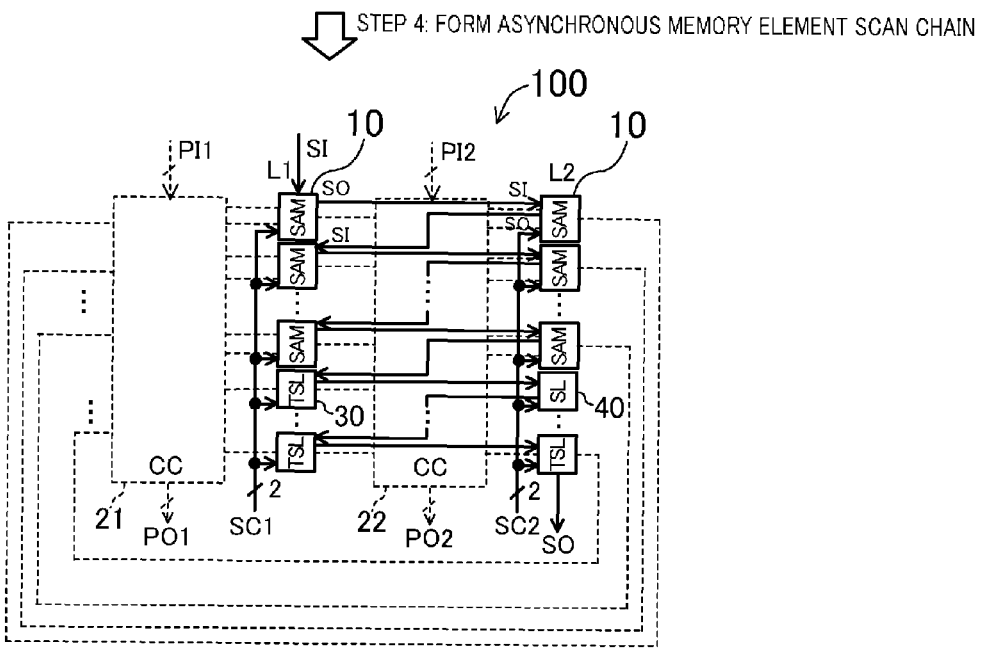
STEP 4: FORM ASYNCHRONOUS MEMORY ELEMENT SCAN CHAIN

ASYNCHRONOUS MEMORY ELEMENT FOR SCANNING

CROSS-REFERENCE TO RELATED APPLICATIONS

This is a continuation of International Application No. PCT/JP2011/003405 filed on Jun. 15, 2011, which claims priority to Japanese Patent Application No. 2010-138609 filed on Jun. 17, 2010. The entire disclosures of these applications are incorporated by reference herein.

BACKGROUND

The present disclosure relates to a technique to enhance testability of semiconductor integrated circuits, and specifically to a technique to enhance testability of an asynchronous circuit including an asynchronous memory element such as a Muller's C-element, an asymmetric C-element, a latch, etc.

Along with miniaturization, increased scale, and reduced power consumption of semiconductor integrated circuits in recent years, the throughput of synchronous circuits has been approaching its limit due to variations in the amount of signal delay caused by fabrication variations, degradation in characteristics, a voltage fluctuation, etc., clock skew, the use of variable clocks, and the like. Thus, the use of asynchronous circuits has been reviewed. In the field of semiconductor integrated circuits, globally asynchronous locally synchronous (GALS) architecture which globally allows asynchronous operation and locally allows synchronous operation is expected to increase.

The asynchronous circuits can operate in a self-timing manner, and thus the asynchronous circuits are less susceptible to various types of signal delay. Moreover, the asynchronous circuits require no operation clock signal, and thus the asynchronous circuits consume no power in a stable state. On the other hand, the asynchronous circuits have to be designed in consideration of hazards and races, and in particular, testing the asynchronous circuits is more difficult than testing the synchronous circuits.

A scan method widely used for the synchronous circuits can be applied in enhancement of testability of the asynchronous circuits. That is, in the scan method, a test is performed in such a manner that a shift register (scan chain) for test is formed, a test pattern is scanned in the shift register, a response pattern of an asynchronous circuit to the test pattern is captured by the shift register, and the response pattern is scanned out.

In a synchronous circuit, at an input side of a flip-flop used as a memory element, a multiplexer configured to select one of an output of a flip-flop of a preceding stage or an output of the synchronous circuit is inserted, thereby easily forming a shift register. In contrast, the asynchronous circuit holds a value, not by a flip-flop, but by a Muller's C-element, etc. which holds a value by signal feedback inside the element, and thus a scan flip-flop for test use only has to be inserted in such a feedback path to form a shift register. Thus, enhancing the testability of the asynchronous circuits increases not only a circuit area overhead, but also a signal delay overhead.

Various methods have been proposed to reduce the circuit area and signal delay overheads associated with enhancing the testability of the asynchronous circuits. For example, the signal delay overhead is reduced by using level sensitive scan design (LSSD) single latch design in which a flip-flop includes an LSSD latch having an L1 latch (master latch) and an L2 latch (slave latch) which operate with different clock signals, and the L2 latch is disposed outside a feedback path. Moreover, the circuit area overhead is minimized by using so-called L1L2* single latch design in which a latch outside a feedback path of each of partial circuits is omitted, and latches of one partial circuit of a combinational circuit obtained by dividing the combinational circuit into two parts and latches of the other partial circuit are alternately connected to form LSSD latches (F. te Beest, A. Peeters, K. Van Berkel, and H. Kerkhoff, "Synchronous full-scan for asynchronous handshake circuits," J. Electron. Test., vol. 19, no. 4, pp. 397-406, 2003).

Alternatively, in the L1L2* single latch design, only a multiplexer is left in the feedback path, and a latch is inserted in a scan path outside the feedback path, thereby minimizing the circuit area and signal delay overheads (International Patent Publication No. WO2006/013524). Moreover, there is a configuration in which independently operable latches are inserted in a feedback path and a scan path to allow a test pattern to be scanned in/out with an internal state of a memory element being maintained (International Patent Publication No. WO2010/001187).

As described above, when the scan method is applied in the enhancement of the testability of the asynchronous circuits, a shift register has to be added, which may increase the circuit area and signal delay overheads. When the L1L2* single latch design is used to solve the above discussed problem, application and observation of a given test pattern can no longer be ensured if there is input/output dependency between the L1 latch and the L2* latch which are paired as an LSSD latch. That is, in the L1L2* single latch design, the asynchronous circuits may not be completely tested. In particular, in the asynchronous circuit disclosed in International Patent Publication No. WO2006/013524, the latch is disposed outside the feedback path, and thus depending on a state of the multiplexer in performing scan in/out operation, the circuit may oscillate if a signal loop including only one latch is formed in the asynchronous circuit.

Moreover, in any of the conventional methods, a test pattern is not stored in an asynchronous memory element which is initially included in the asynchronous circuit, but a test pattern and a response pattern of the asynchronous circuit are stored by a flip-flop or a latch which is additionally inserted. Thus, only scanning in the test pattern and scanning out the response pattern cannot test an asynchronous memory element such as a Muller's C-element. That is, the asynchronous memory element is incompletely tested.

Thus, there is a need for an improved asynchronous memory element (hereinafter referred to as "scan asynchronous memory element") suitable for enhancement of testability of asynchronous circuits. Moreover, there are needs for a semiconductor integrated circuit which includes such a scan asynchronous memory element and has design for enhanced testability, a method for designing such a semiconductor integrated circuit, and a method for generating a test pattern for such a semiconductor integrated circuit.

SUMMARY

For example, a scan asynchronous memory element includes: an asynchronous memory element configured to receive an n-input, where n is an integer greater than or equal to 2; and a scan control logic circuit configured to generate the n-input to the asynchronous memory element from an n-bit signal input and a scan input, wherein as the n input to the asynchronous memory element, the scan control logic circuit outputs the signal input when a control signal supplied to the scan control logic circuit has a first bit pattern, the scan control logic circuit outputs the scan input when the control signal has a second bit pattern, and the scan control logic circuit outputs a bit pattern allowing the asynchronous memory element to hold a current state when the control signal has a bit pattern other than the first and second bit patterns. Note that the term "asynchronous memory element" here refers to a general element used as a memory element, such as Muller's C-elements, asymmetric C-elements, latches, etc. in an asynchronous circuit.

A semiconductor integrated circuit includes: a combinational circuit; and the above-described scan asynchronous memory element including a plurality of scan asynchronous memory elements. The signal inputs and outputs of the plurality of scan asynchronous memory elements are connected to the combinational circuit. The plurality of scan asynchronous memory elements are cascade-connected such that an output of a preceding stage is connected to a scan input of a succeeding stage.

Specifically, in the semiconductor integrated circuit, the combinational circuit includes first and second partial circuits, where an output of one of the first and second partial circuits is input, via the scan asynchronous memory elements, to the other of the first and second partial circuits. The scan asynchronous memory elements of odd-numbered stages are commonly controlled by a first control signal, signal inputs to the scan asynchronous memory elements of the odd-numbered stages are connected to the first partial circuit, and outputs of the scan asynchronous memory elements of the odd-numbered stages are connected to the second partial circuit. The scan asynchronous memory elements of even-numbered stages are commonly controlled in the same manner by a second control signal, signal inputs to the scan asynchronous memory elements of the even-numbered stages are connected to the second partial circuit, and outputs of the scan asynchronous memory elements of the even-numbered stages are connected to the first partial circuit.

A method for designing by a computer the above-described semiconductor integrated circuit includes: replacing asynchronous memory elements included in an original asynchronous circuit with the scan asynchronous memory elements; grouping the scan asynchronous memory elements into first and second latches, and dividing a combinational circuit included in the original asynchronous circuit into the first and second partial circuits; determining input/output dependency between the first and second latches; and alternately connecting the first and second latches between which there is no input/output dependency, and connecting the output of the preceding stage to the scan input of the succeeding stage.

A method for generating by a computer a test pattern to test the combinational circuit included in the above-described semiconductor integrated circuit includes: generating a basic test pattern to be applied to the combinational circuit; computing an expected response pattern which is an expected value of a response pattern of the combinational circuit to the basic test pattern; and determining, based on the expected response pattern, a bit pattern of the control signal as part of the test pattern, where in capturing the response pattern of the combinational circuit to the basic test pattern, the bit pattern of the control signal is used for holding operation of the scan asynchronous memory element which captures the response pattern.

The method for generating the test pattern preferably may include: generating, based on the expected response pattern, a capture pattern as part of the test pattern, where in applying the basic test pattern to the combinational circuit, the capture pattern is used to capture a response pattern including an error caused by a fault to be detected by the basic test pattern without losing the error.

Alternatively, the method for generating the test pattern preferably may include: determining, based on the expected response pattern, a bit pattern of the control signal as part of the test pattern, where after the basic test pattern is scanned in the plurality of scan asynchronous memory elements, and before a response pattern of the combinational circuit to the basic test pattern is captured, the bit pattern of the control signal is used for holding operation of the scan asynchronous memory element which captures the response pattern of the combinational circuit.

Alternatively, a method for generating by a computer a test pattern to test the combinational circuit included in the above-described semiconductor integrated includes: forming a circuit model in which the plurality of scan asynchronous memory elements are replaced with time expansion models each of which is obtained through time expansion of the asynchronous memory element included in the scan asynchronous memory element, and receives a signal input of the combinational circuit which corresponds to the signal input of the scan asynchronous memory element of the preceding stage and an output of the scan asynchronous memory element of the succeeding stage, signal inputs of the first and second partial circuits are replaced with primary inputs, and outputs of the time expansion models are replaced with primary outputs; and generating test patterns for the first and second partial circuits of the circuit model.

A method for generating by a computer a test pattern to test the scan asynchronous memory element included in the above-described semiconductor integrated circuit includes: determining a scan input of the scan asynchronous memory element to be tested and a bit pattern of the control signal such that a first state transition in which the scan asynchronous memory element to be tested holds a current state, a second state transition in which a hold value is flushed to the current state, and a third state transition in which the hold value changes are all reproduced.

BRIEF DESCRIPTION OF THE DRAWINGS

FIGS. 6A and 6B are views schematically illustrating a method for designing the semiconductor integrated circuit of FIG. 4.

DETAILED DESCRIPTION

Embodiments are described in detail below with reference to the attached drawings. However, unnecessarily detailed description may be omitted. For example, detailed description of well known techniques or description of the substantially same elements may be omitted. Such omission is intended to prevent the following description from being unnecessarily redundant and to help those skilled in the art easily understand it.

Inventors provide the following description and the attached drawings to enable those skilled in the art to fully understand the present disclosure. Thus, the description and the drawings are not intended to limit the scope of the subject matter defined in the claims.

(Embodiment of Scan Asynchronous Memory Element)

Figure 1:
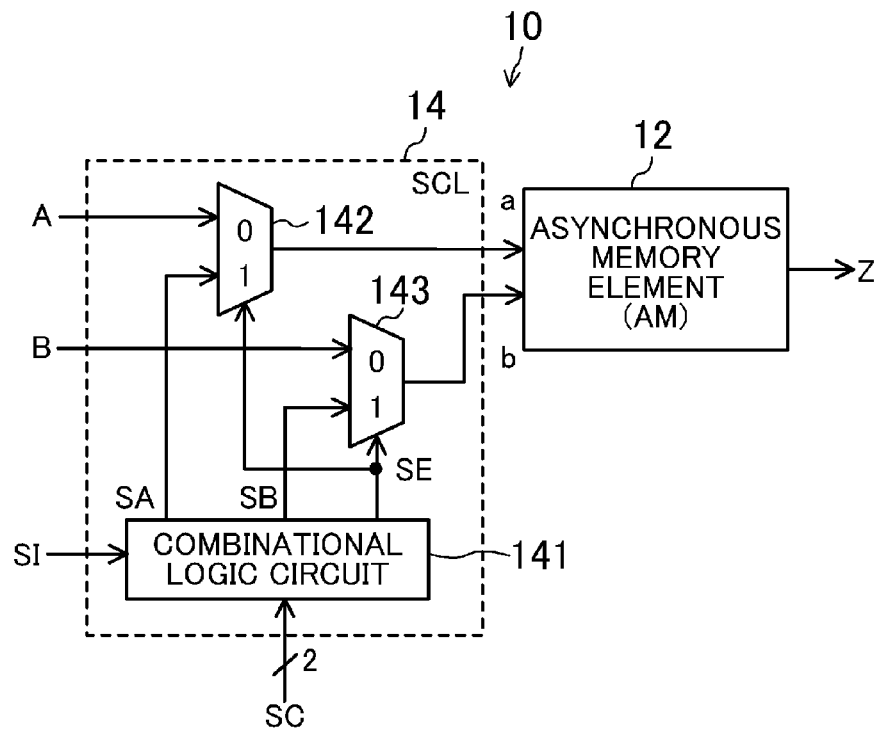
FIG. 1 is a view illustrating a configuration of a scan asynchronous memory element according to an embodiment of the present disclosure.

FIG. 1 illustrates a configuration of a scan asynchronous memory element according to an embodiment of the present disclosure. A scan asynchronous memory element 10 according to the present embodiment includes an asynchronous memory element (AM) 12, and a scan control logic circuit (SCL) 14 connected to an input of the asynchronous memory element 12. The asynchronous memory element 12 is an element which receives no synchronous clock signal, and stores an input signal independently of the other memory elements. For example, the asynchronous memory element 12 may be a C-element which is implemented by a majority function for performing an operation of a majority decision of three inputs, inputs (a, b) and a feedback output Z. When the asynchronous memory element 12 is a C-element, an output transitions to "1" when the inputs (a, b) transition to "11," and the output transitions to "0" when the inputs (a, b) transition to "00." A current state is held when the inputs (a, b) are "01" or "10" (see, Table 1).

TABLE 1

| a | b | Z |
|---|---|---|
| 0 | 0 | 0 |
| 0 | 1 | Hold State |
| 1 | 0 | Hold State |
| 1 | 1 | 1 |

The asynchronous memory element 12 may be a D latch. For example, when the asynchronous memory element 12 is a D latch in which the input (a) is a data input, and the input (b) is a strobe pulse input, the input (a) is output as it is while the input (b) is "1," and the asynchronous memory element 12 holds a current state while the input (b) is "0" (see, Table 2).

TABLE 2

| a | b | Z |
|---|---|---|
| 0 | 0 | Hold State |
| 0 | 1 | 0 |
| 1 | 0 | Hold State |
| 1 | 1 | 1 |

The asynchronous memory element 12 may be an SR latch. For example, when the asynchronous memory element 12 is a positive logic SR latch in which the input (a) is a set input, and the input (b) is a reset input, an output transitions to "1" when the inputs (a, b) transition to "10," and the output transitions to "0" when the inputs (a, b) transition to "01." When the inputs (a, b) are "00," a current state is held, and when the inputs (a, b) are "11," this indicates an inhibit input. In the case of a negative logic SR latch, an output transitions to "1" when inputs (a, b) transition to "01," and the output transitions to "0" when the inputs (a, b) transition to "10." When the inputs (a, b) are "11," a current state is held, and when the inputs (a, b) are "00," this indicates an inhibit input (see, Table 3).

TABLE 3

| a | b | Z |
|---|---|---|
| 0 (or 1) | 0 (or 1) | Hold State |
| 0 | 1 | 0 (or 1) |
| 1 | 0 | 1 (or 0) |

Note that when the asynchronous memory element 12 is a latch, the asynchronous memory element 12 may also output an inversion of the output Z.

The scan control logic circuit 14 is a logic circuit configured to generate the inputs (a, b) of the asynchronous memory element 12 from signal inputs (A, B) and a scan input (SI). For example, the scan control logic circuit 14 may include a combinational logic circuit 141, and two multiplexers 142, 143. Based on a bit pattern of a SC, the combinational logic circuit 141 outputs the SI as 2-bit scan inputs (SA, SB), and outputs a scan enable signal (SE). Based on the SE, the multiplexer 142 outputs any one of the A or the SA as the a. Based on the SE, the multiplexer 143 outputs any one of the B or the SB as the b.

For example, when the asynchronous memory element 12 is a C-element, and the is "00," the scan control logic circuit 14 outputs the A, B as they are. In this case, the scan asynchronous memory element 10 operates as a Muller's C-element to which the A, B are input. When the SC is "11," the scan control logic circuit 14 outputs the SI as the a, b. In this case, the output of the scan asynchronous memory element 10 transitions to the SI. That is, the SI scanned in the scan asynchronous memory element 10 can be stored in the scan asynchronous memory element 10. When the SC is "01" or "10," the scan control logic circuit 14 outputs "01" or "10." In this case, the scan asynchronous memory element 10 holds a current state (see, Table 4). Note that "X" in Table 4 and in subsequent tables represents "don't care."

TABLE 4

| SC | SE | a | b | SA | SB | Operation |
|---|---|---|---|---|---|---|
| 0 | 0 | 0 | A | B | X | X | Normal |
| 0 | 1 | 1 | 0 | 1 | 0 | 1 | Scan Shift (Hold State) |
| 1 | 0 | 1 | 1 | 0 | 1 | 0 | Scan Shift (Hold State) |
| 1 | 1 | 1 | SI | SI | SI | SI | Scan Shift (SI) |

Alternatively, when the asynchronous memory element 12 is a D latch in which the input (a) is a data input, and the input (b) is a strobe pulse input, and the SC is "00," the scan control logic circuit 14 outputs the A, B as they are. In this case, the scan asynchronous memory element 10 serves as a D latch to which the A, B are input. When the SC is "11," the scan control logic circuit 14 outputs the SI as the a, and outputs "1" as the b. In this case, the output of the scan asynchronous memory element 10 transitions to the SI. That is, the SI scanned in the scan asynchronous memory element 10 can be stored in the scan asynchronous memory element 10. When the SC is "01" or "10," the scan control logic circuit 14 outputs "X0." Note that "X" represents "don't care." In this case, the scan asynchronous memory element 10 holds a current state (see, Table 5). Note that, as described later, the scan control logic circuit 14 preferably outputs different bit patterns so that the bit pattern of the SC associated with the holding operation of the scan asynchronous memory element 10 can suitably be selected based on an expected response pattern of the combinational circuit in testing a semiconductor integrated circuit. For example, the scan control logic circuit 14 preferably outputs "00" when the SC is "01," and outputs "10" when the SC is "10."

TABLE 5

| SC | SE | a | b | SA | SB | Operation |
|----|----|----|----|----|----|-----------|
| 0 | 0 | 0 | A | B | X | X | Normal |
| 0 | 1 | 1 | X | 0 | X | 0 | Scan Shift (Hold State) |
| 1 | 0 | 1 | X | 0 | X | 0 | Scan Shift (Hold State) |
| 1 | 1 | 1 | SI | 1 | SI | 1 | Scan Shift (SI) |

Alternatively, when the asynchronous memory element 12 is a positive logic SR latch in which the input (a) is a set input, and the input (b) is a reset input, and the SC is "00," the scan control logic circuit 14 outputs the A, B as they are. In this case, the scan asynchronous memory element 10 operates as an SR latch to which the A, B are input. When the SC is "11," the scan control logic circuit 14 outputs the SI as the a, and outputs an inversion of the SI as the b. In this case, the output of the scan asynchronous memory element 10 transitions to the SI. That is, the SI scanned in the scan asynchronous memory element 10 can be stored in the scan asynchronous memory element 10. When the SC is "01" or "10," the scan control logic circuit 14 outputs "00." In this case, the scan asynchronous memory element 10 holds a current state. In the case of a negative logic SR latch, the scan control logic circuit 14 outputs an inversion of the SI as the a, and outputs the SI as the b when the SC is "11," and the scan control logic circuit 14 outputs "11" when the SC is "01" or "10" (see, Table 6).

TABLE 6

| SC | SE | a | b | SA | SB | Operation |
|----|----|----|----|----|----|-----------|
| 0 | 0 | 0 | A | B | X | X | Normal |
| 0 | 1 | 1 | 0 (or 1) | 0 (or 1) | 0 (or 1) | 0 (or 1) | Scan Shift (Hold State) |
| 1 | 0 | 1 | 0 (or 1) | 0 (or 1) | 0 (or 1) | 0 (or 1) | Scan Shift (Hold State) |
| 1 | 1 | 1 | SI (or $\overline{SI}$) | $\overline{SI}$ (or SI) | SI (or $\overline{SI}$) | $\overline{SI}$ (or SI) | Scan Shift (SI) |

As described above, the scan asynchronous memory element according to the present embodiment can be formed by adding the two multiplexers 142, 143 and the scan control logic circuit 14 having a simple circuit configuration to the asynchronous memory element 12 which is commonly used, and thus the circuit area overhead is relatively small. Moreover, only one stage, the multiplexer 142 or 143, is inserted in a signal path, and thus the signal delay overhead can be minimized.

Moreover, the asynchronous memory element 12 itself stores the scan input, and thus as described later, a scan test can completely test a storage function of the asynchronous memory element 12. Moreover, as described later, determining the bit pattern of the SC in consideration of an internal race allows control without a race.

Note that the scan control logic circuit 14 is not limited to the above-described configuration. The scan control logic circuit 14 may have any configuration as long as the inputs and the outputs shown in Table 4, Table 5, and Table 6 can be obtained.

Figure 2:
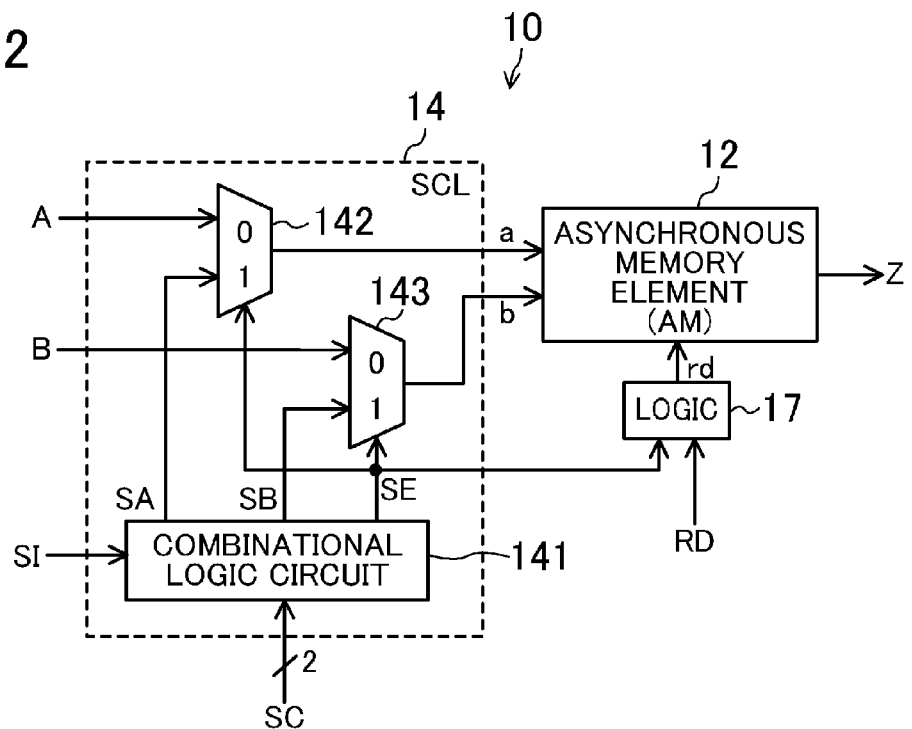
FIG. 2 is a view illustrating a configuration of a scan asynchronous memory element according to a variation.

When the asynchronous memory element 12 has a setting function or a resetting function, a combinational circuit 17 configured to perform a logical operation of the SE and a set signal or a reset signal RD may be added as illustrated in FIG. 2 to feed an output of the combinational circuit 17 to the asynchronous memory element 12 as a set signal or a reset signal (rd) so that setting operation or resetting operation is not executed when the SE is "1."

Figure 3:
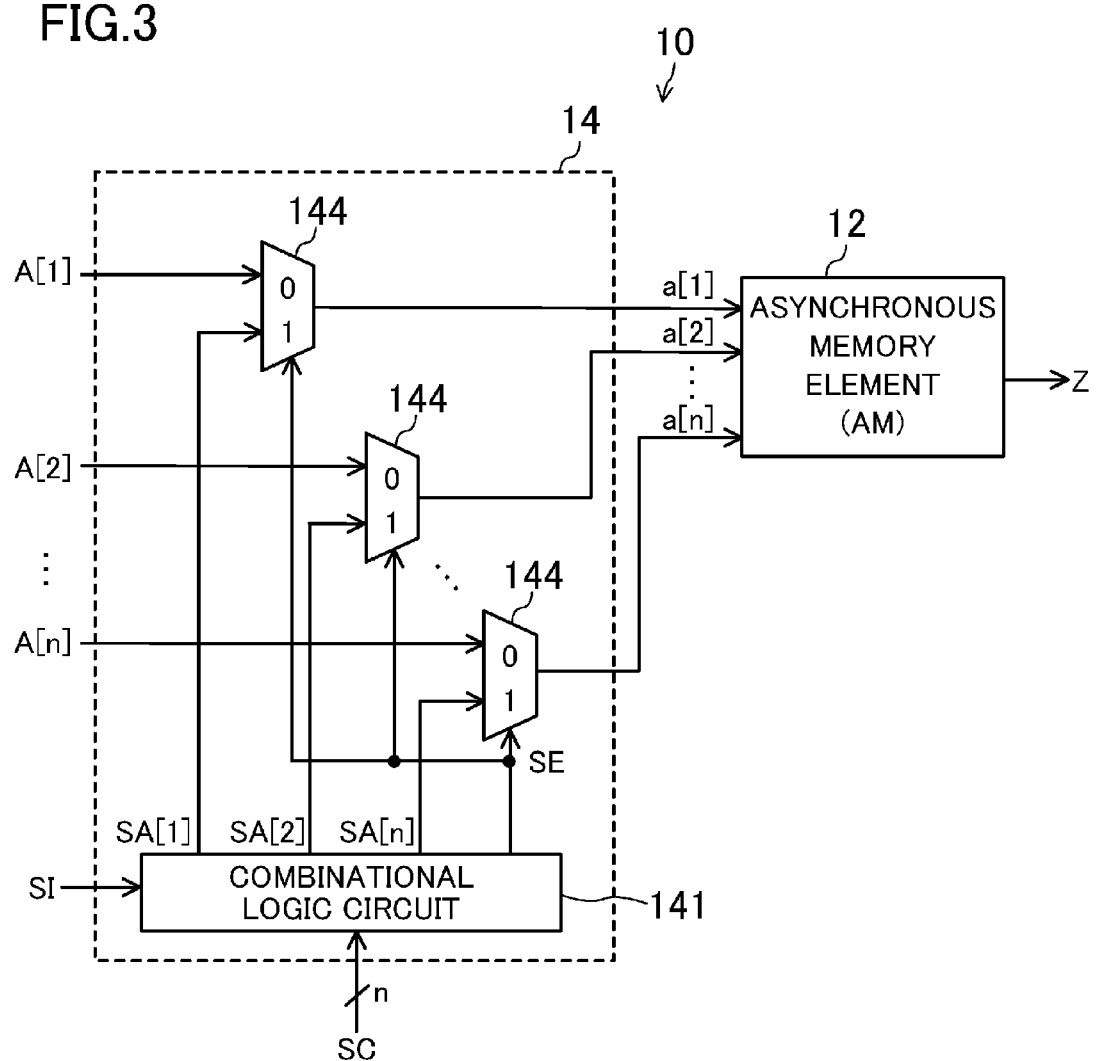
FIG. 3 is a view illustrating a configuration of a scan asynchronous memory element according to another variation.

When a C-element is used as the asynchronous memory element 12, the signal input of the scan asynchronous memory element 10 is not limited to 2 bits. The signal input of the scan asynchronous memory element 10 may be larger than or equal to 3 bits. FIG. 3 illustrates a configuration of a variation of the scan asynchronous memory element 10. N-bit signals A[1] to A[n] are input to the scan asynchronous memory element 10. When the signal input is n bits, the number of multiplexers 144 included in the scan asynchronous memory element 10 is n, and the scan control logic circuit 14 generates an n-bit scan input including signals SA[1] to SA[n] based on an n-bit SC. The output of the asynchronous memory element 12 transitions to "1" when all the bits of the input signals transition to "1," the output of the asynchronous memory element 12 transitions to "0" when all the bits transition to "0," and otherwise, a current state is held. Basically, the n-bit scan input may be the same as the SC. When types of the bit patterns of the SC which allows the scan asynchronous memory element 10 to hold a current state are reduced, the storage function of the asynchronous memory element 12 cannot be completely tested, but the SC can be n−1 bits or smaller.

The asynchronous memory element 12 may be a two-or-more-input asymmetric C-element. Even when not all the bits of the signal input transition to "1" (or "0"), an output of the asymmetric C-element transitions to "1" (or "0"). Also in this case, the number of multiplexers included in the scan asynchronous memory element 10 is n, and the scan control logic circuit 14 generates an n-bit scan input based on an n-bit SC. Note that unlike the case of the Muller's C-element, the n-bit scan input which allows the scan asynchronous memory element 10 to hold a current state has to have specific bit patterns independently of the SC.

(Embodiment of Semiconductor Integrated Circuit)

Figure 4:
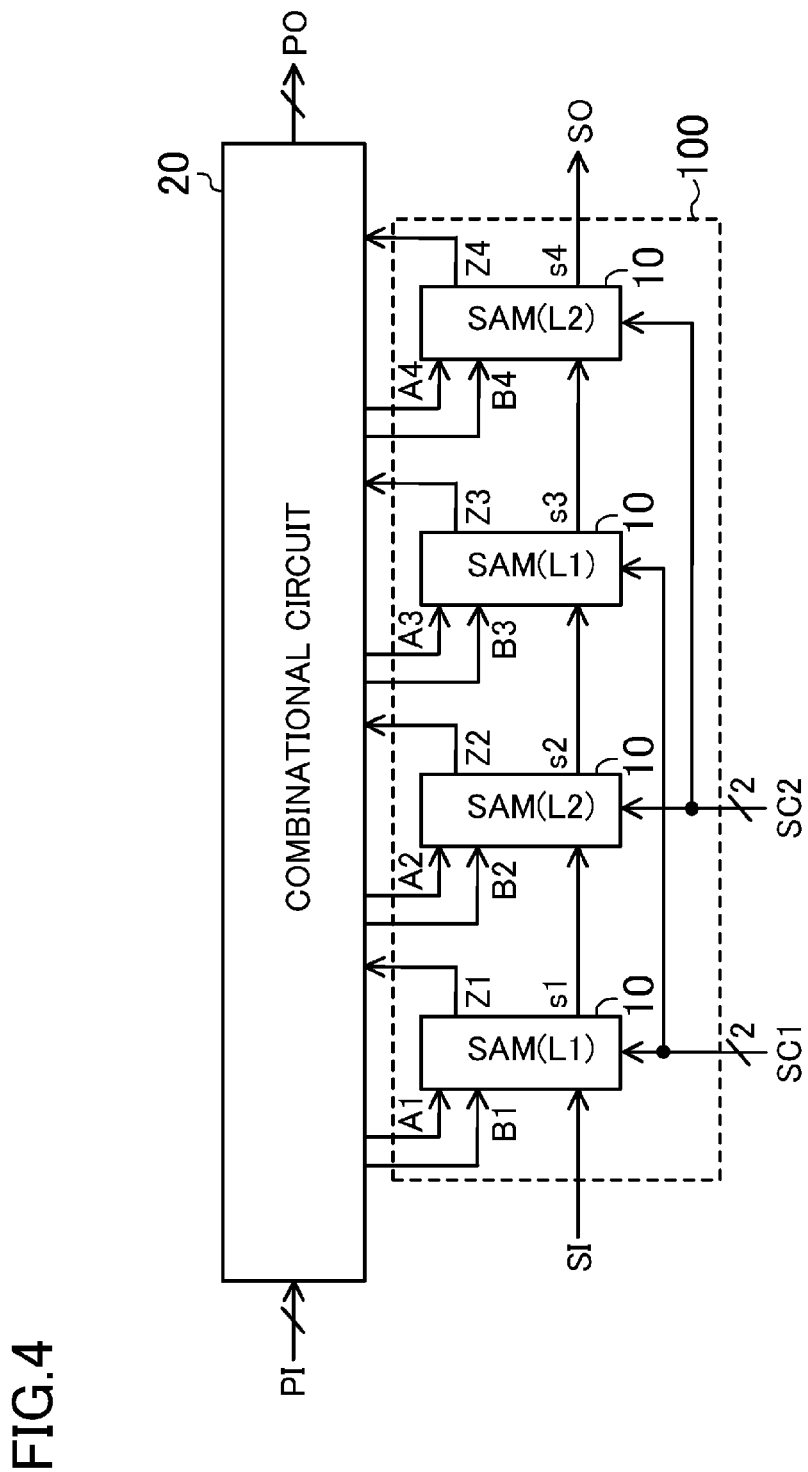
FIG. 4 is a view illustrating a configuration of a semiconductor integrated circuit according to an embodiment of the present disclosure.

FIG. 4 illustrates a configuration of the semiconductor integrated circuit according to an embodiment of the present disclosure. The semiconductor integrated circuit according to the present embodiment includes a combinational circuit (CC) 20 configured to generate a signal output PO from a signal input PI, and a plurality of scan asynchronous memory elements (SAM) 10. Signal inputs (A, B) and an output (Z) of each of the scan asynchronous memory elements 10 are connected to the combinational circuit 20. Here, the combinational circuit 20 has no feedback path, and uses each scan asynchronous memory element 10 as a memory element. As long as the combinational circuit 20 can be regarded as a combinational circuit having no feedback path in performing a test which will be described later, the combinational circuit 20 may be an asynchronous circuit having a mechanism realizing the combinational circuit having no feedback path.

Figure 5:
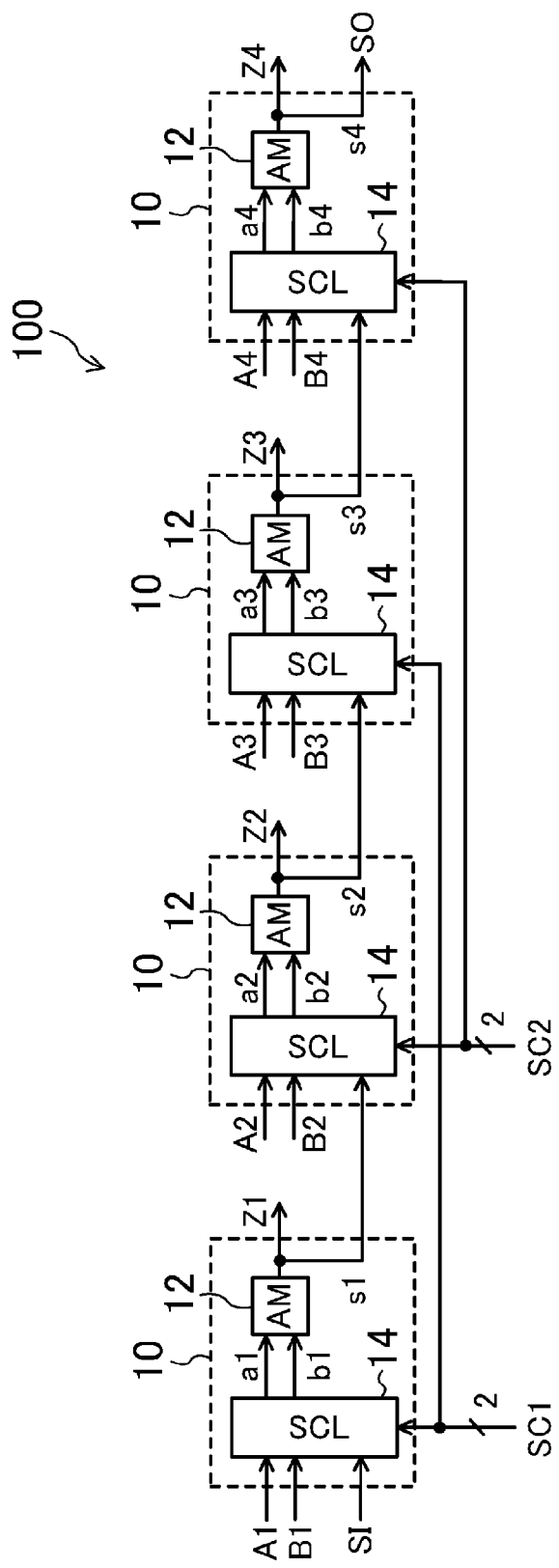
FIG. 5 is a view illustrating a configuration of an asynchronous memory element scan chain.

The scan asynchronous memory elements 10 are cascade-connected so that an output of the scan asynchronous memory elements 10 in a preceding stage is connected to a scan input of the scan asynchronous memory elements 10 in a succeeding stage (see, FIG. 5), thereby forming an asynchronous memory element scan chain 100. The asynchronous memory element scan chain 100 can shift a scan input SI of a scan asynchronous memory element 10 in a first stage into each of the scan asynchronous memory elements 10 in succeeding stages. Moreover, the asynchronous memory element scan chain 100 can shift a value held by each scan asynchronous memory element 10 to output the value as a scan output (SO) from the scan asynchronous memory element 10 in the last stage.

In the asynchronous memory element scan chain 100, the scan asynchronous memory elements 10 in odd-numbered stages are controlled by a control signal (SC1), and the scan asynchronous memory elements 10 in even-numbered stages are controlled by a control signal (SC2). That is, two scan asynchronous memory elements 10 adjacent to each other form an LSSD latch. Thus, the semiconductor integrated circuit according to the present embodiment has the effect of reducing the signal delay overhead by each scan asynchronous memory element 10, and additionally, can also minimize the circuit area overhead by using the L1L2* single latch design. Note that it is also possible to use LSSD double latch design or LSSD single latch design.

Note that as described above, the signal input to the scan asynchronous memory element 10 is not limited to 2 bits. Moreover, the number of the scan asynchronous memory elements 10 included in the asynchronous memory element scan chain 100 is not limited to four. When five or more scan asynchronous memory elements 10 are provided, scan asynchronous memory elements controlled by the SC1 and scan asynchronous memory elements controlled by the SC2 may be connected in an alternate order to form an asynchronous memory element scan chain 100.

<Semiconductor Integrated Circuit Design>

Next, semiconductor integrated circuit design according to the present embodiment will be described with reference to FIGS. 6A and 6B. Note that the semiconductor integrated circuit design according to the present embodiment may be created by allowing a computer to execute the following steps. The semiconductor integrated circuit of FIG. 4 can be obtained by modifying an existing asynchronous circuit. First, in step 1, asynchronous memory elements 12 included in an original asynchronous circuit are replaced with scan asynchronous memory elements 10. Next, in step 2, the scan asynchronous memory elements 10 are grouped into L1 latches and L2 latches, and a combinational circuit 20 included in the original asynchronous circuit is divided into partial circuits 21, 22. From a signal input PI1 which is part of a signal input PI of the combinational circuit 20, the partial circuit 21 generates a signal output PO1 which is part of a signal output PO. From a signal input PI2 which is the rest of the signal input PI of the combinational circuit 20, the partial circuit 22 generates a signal output PO2 which is the rest of the signal output PO. Each scan asynchronous memory element 10 serving as the L1 latch has signal inputs connected to the partial circuit 21, and an output connected to the partial circuit 22. Each scan asynchronous memory element 10 serving as the L2 latch has signal inputs connected to the partial circuit 22, and an output connected to the partial circuit 21.

Figure 7:
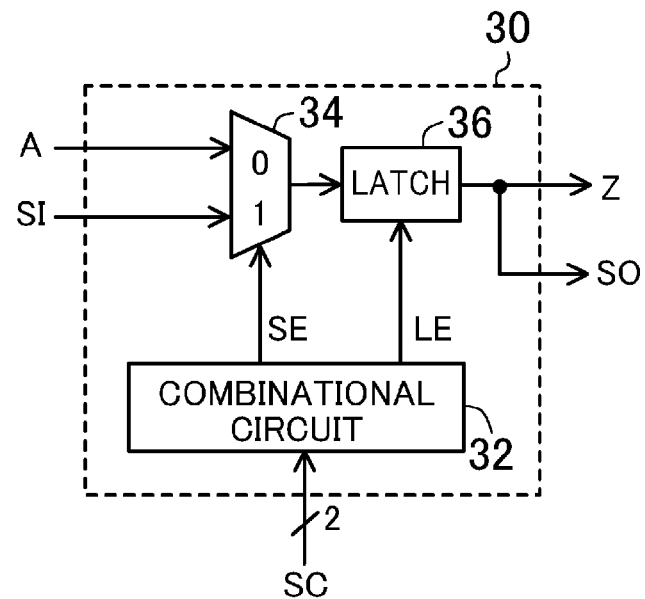
FIG. 7 is a view illustrating a configuration of a transparent scan latch.

Note that when the scan asynchronous memory elements 10 alone cannot completely divide the combinational circuit 20, a transparent scan latch (TSL) 30 may accordingly be inserted as a L1 latch or a L2 latch between the partial circuits 21, 22. FIG. 7 illustrates an example configuration of the transparent scan latch 30. The transparent scan latch 30 includes a combinational logic circuit 32, a multiplexer 34, and a latch 36. The combinational logic circuit 32 outputs a scan enable signal (SE) and a load enable signal (LE) based on a bit pattern of a control signal (SC) which is the same control signal of the scan asynchronous memory element 10. The multiplexer 34 outputs any one of a signal input (A) or a scan input (SI) based on the SE. The latch 36 latches the output of the multiplexer 34 based on the LE.

For example, when the SC is "00," the transparent scan latch 30 outputs the A as it is. In this case, the transparent scan latch 30 operates merely as a signal line. When the SC is "11," the transparent scan latch 30 outputs the SI. When the SC is "01" or "10," the transparent scan latch 30 holds a current state (see, Table 7).

TABLE 7

| SC | SE | LE | Operation |
|----|----|----|-----------|
| 0  | 0  | 0  | 1 Normal |
| 0  | 1  | X  | 0 Scan Shift (Hold State) |
| 1  | 0  | X  | 0 Scan Shift (Hold State) |
| 1  | 1  | 1  | 1 Scan Shift (SI) |

After the combinational circuit 20 is divided, the L1 latches and the L2 latches may be connected in an alternate order to form an asynchronous memory element scan chain, but here, fault detectability has to be taken into consideration. For example, when the asynchronous memory element 12 is a C-element, the scan asynchronous memory element 10 holds a current state if "01" is input to the scan asynchronous memory element 10 instead of "00" due to a fault. Here, when the current state of the scan asynchronous memory element 10 is "0," the output remains "0" in both cases where a normal value is input, and a fault value is input, and thus the fault cannot be detected. In contrast, when the current state is set to "1," the output transitions to "0" if a normal value "00" is input, and the output remains "1" if a fault value "01" is input, so that the fault can be detected. The relationship between the input/output of the scan asynchronous memory element 10 and the fault detectability in the case where the asynchronous memory element 12 is a C-element is shown in Table 8. Note that the relationship applies to the Muller's C-element, etc.

TABLE 8

| A   | B   | Z | Fault Detectability |
|-----|-----|---|---------------------|
| 0   | 0/1 | 1 | Detectable |
| 0   | 1/0 | 1 | Detectable |
| 1   | 0/1 | 0 | Detectable |
| 1   | 1/0 | 0 | Detectable |
| 0/1 | 0   | 1 | Detectable |
| 1/0 | 0   | 1 | Detectable |
| 0/1 | 1   | 0 | Detectable |
| 1/0 | 1   | 0 | Detectable |

TABLE 8-continued

| A | B | Z | Fault Detectability |
|---|---|---|---|
| 0/1 | 0/1 | X | Detectable |
| 1/0 | 0/1 | X | Undetectable |
| 0/1 | 1/0 | X | Undetectable |
| 1/0 | 1/0 | X | Detectable |

Note
that in α/β, α is the normal value, and β is the fault value.

When the asynchronous memory element 12 is a D latch in which the input (a) is a data input, the input (b) is a strobe pulse input, an output of the scan asynchronous memory element 10 transitions to "0" if "01" is input to the scan asynchronous memory element 10 instead of "00" due to a fault. Here, when the current state of the scan asynchronous memory element 10 is "0," the output does not transition from "0" in both cases where a normal value is input, and a fault value is input, and thus the fault cannot be detected. In contrast, when the current state is set to "1," the output remains "1" if the normal value "00" is input, and the output transitions to "0" if the fault value "01" is input, and thus the fault can be detected. The relationship between the input/output of the scan asynchronous memory element 10 and the fault detectability in the case where the asynchronous memory element 12 is a D latch in which the input (a) is a data input, and the input (b) is the strobe pulse input is shown in Table 9.

TABLE 9

| A | B | Z | Fault Detectability |
|---|---|---|---|
| 0 | 0/1 | 1 | Detectable |
| 0 | 1/0 | 1 | Detectable |
| 1 | 0/1 | 0 | Detectable |
| 1 | 1/0 | 0 | Detectable |
| 0/1 | 0 | X | Undetectable |
| 1/0 | 0 | X | Undetectable |
| 0/1 | 1 | 0 | Detectable |
| 1/0 | 1 | 1 | Detectable |
| 0/1 | 0/1 | 0 | Detectable |
| 1/0 | 0/1 | 1 | Detectable |
| 0/1 | 1/0 | 1 | Detectable |
| 1/0 | 1/0 | 0 | Detectable |

Note
that in α/β, α is the normal value, and β is the fault value.

When the asynchronous memory element 12 is a positive logic SR latch in which the input (a) is a set input, and the input (b) is a reset input, an output of the scan asynchronous memory element 10 transitions to "0" if "01" is input to the scan asynchronous memory element 10 instead of "00" due to a fault. Here, when the current state of the scan asynchronous memory element 10 is "0," the output does not transition from "0" in both cases where a normal value is input, and a fault value is input, and thus the fault cannot be detected. In contrast, when the current state is set to "1," the output remains "1" if the normal value "00" is input, and the output transitions to "0" if the fault value "01" is input, and thus the fault can be detected. The relationship between the input/output of the scan asynchronous memory element 10 and the fault detectability in the case where the asynchronous memory element 12 is a positive logic SR latch in which the input (a) is a set input, and the input (b) is a reset input is shown in Table 10.

TABLE 10

| A | B | Z | Fault Detectability |
|---|---|---|---|
| 0 | 0/1 | 1 | Detectable |
| 0 | 1/0 | 1 | Detectable |
| 1 | 0/1 | X | Undetectable |
| 1 | 1/0 | X | Undetectable |
| 0/1 | 0 | 0 | Detectable |
| 1/0 | 0 | 0 | Detectable |
| 0/1 | 1 | X | Undetectable |
| 1/0 | 1 | X | Undetectable |
| 0/1 | 0/1 | X | Undetectable |
| 1/0 | 0/1 | X | Detectable |
| 0/1 | 1/0 | X | Detectable |
| 1/0 | 1/0 | X | Undetectable |

Note
that in α/β, α is the normal value, and β is the fault value.

Thus, in view of the fault detectability of the scan asynchronous memory element 10, each LSSD latch including a pair of L1 and L2 latches has to be capable of holding a test pattern and a response pattern in response to the test pattern which do not influence on each other. Thus, the asynchronous memory element scan chain is formed according to the following steps to ensure the independency between the test pattern and the response pattern.

Referring to FIG. 6B, the combinational circuit 20 has been divided into the partial circuits 21, 22, and then in step 3, the input/output dependency between the L1 latch and the L2 latch is determined for each scan asynchronous memory element 10 and each transparent scan latch 30. Specifically, each of the scan asynchronous memory elements 10 and the transparent scan latches 30 is regarded as an apex to determine a pseudo output cone which is a collection of outputs of the scan asynchronous memory elements 10 and the transparent scan latches 30 belonging to the other groups, the outputs being connected to an input of the apex. As illustrated in the figure, when an input portion of a pseudo output cone whose apex is one of a given L1 latch and a given L2 latch does not include an output of the other of the given L1 latch and the given L2 latch, it can be said that there is no input/output dependency between the L1 latch and the L2 latch.

Figure 8:
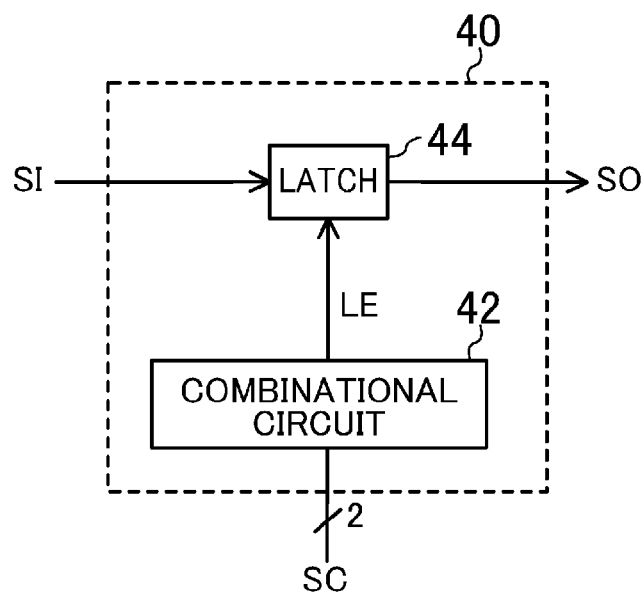
FIG. 8 is a view illustrating a configuration of a scan latch.

The input/output dependency between the L1 latch and the L2 latch is determined, and then in step 4, the L1 latches and the L2 latches between which there is no input/output dependency are connected in an alternate order, and an output of a preceding stage is connected to a scan input of a succeeding stage, thereby forming an asynchronous memory element scan chain 100. The larger the input portion of the pseudo output cone is, the more difficult it is to find a pair of L1 and L2 latches between which there is no input/output dependency. Thus, pseudo output cones having large input portions may preferentially be selected and connected. However, there is a case where a pair of L1 and L2 latches between which there is no input/output dependency is not found. In this case, a scan latch (SL) 40 may be inserted as a counterpart of the L1 or L2 latch. FIG. 8 illustrates an example configuration of the scan latch 40. The scan latch 40 can include a combinational logic circuit 42 and a latch 44. The combinational logic circuit 42 outputs a load enable signal (LE) based on a bit pattern of a control signal SC which is the same control signal of the scan asynchronous memory element 10. The latch 44 latches the scan input SI based on the LE. The scan latch 40 does not receive signal inputs.

For example, when the SC is "00," the scan latch 40 outputs "don't care." When the SC is "11," the scan latch 40 outputs the SI. When the SC is "01" or "10," the scan latch 40 holds a current state (see, Table 11).

TABLE 11

| SC | | LE | Operation |
|---|---|---|---|
| 0 | 0 | X | Don't Care |
| 0 | 1 | 0 | Scan Shift (Hold State) |
| 1 | 0 | 0 | Scan Shift (Hold State) |
| 1 | 1 | 1 | Scan Shift (SI) |

As described above, according to the present design method, in particular, in step 3 and step 4, a pair of an L1 latch and an L2 latch between which there is no input/output dependency forms each LSSD latch. Thus, the independency between the test pattern and the response pattern can be ensured, and it is possible to detect all faults in the combinational circuit 20.

Note that the design method is also applicable to conventional asynchronous circuits which do not include the scan asynchronous memory elements 10. In a conventional asynchronous circuit, instead of step 1 in which asynchronous memory elements such as C-elements included in an original asynchronous circuit are replaced with scan asynchronous memory elements, for example, multiplexers and latches may be inserted in feedback paths of the C-elements to modify the original asynchronous circuit into an asynchronous circuit having L1L2* single latch design.

<Testing Semiconductor Integrated Circuit>

Next, testing the combinational circuit 20 included in the semiconductor integrated circuit will be described. The asynchronous memory element scan chain 100 illustrated in FIG. 6B includes LSSD latches each composed of an L1 latch and an L2 latch. Thus, the partial circuits 21, 22 have to be independently tested. That is, the partial circuit 21 is tested by alternately repeating an L1 L2 shift in which a test pattern is shifted, where the L1 latches are master latches and the L2 latches are slave latches, and an L2L1 shift in which a test pattern is shifted, where the L2 latches are master latches and the L1 latches are slave latches, applying a test pattern from the L2 latches to the partial circuit 21, and capturing a response pattern of the partial circuit 21 by the L1 latches (this operation is hereinafter referred to as "L1 capture"). On the other hand, the partial circuit 22 is tested by alternately repeating the L2L1 shift and the L1L2 shift, applying a test pattern from the L1 latches to the partial circuit 22, and capturing a response pattern of the partial circuit 22 by the L2 latch (this operation is hereinafter referred to as "L2 capture").

Figure 9:
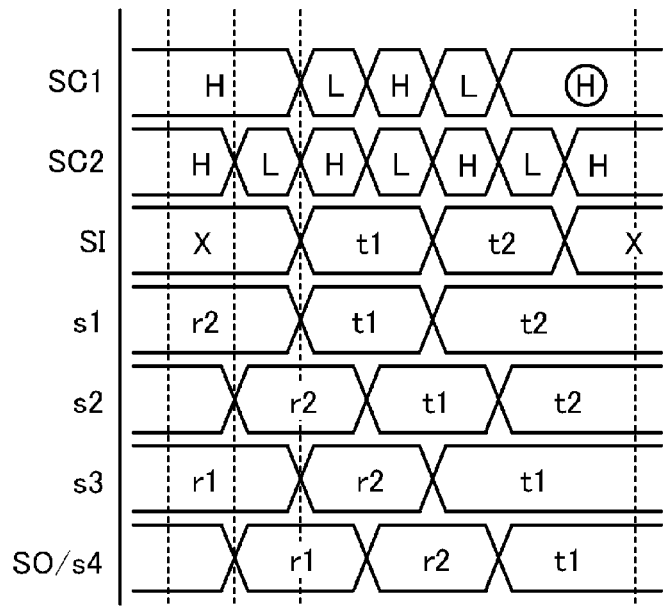
FIG. 9 is a timing diagram of an L1L2 shift.

FIG. 9 is a timing diagram of the L1L2 shift. The value "H" of the SC1, SC2 in the figure represents a bit pattern "01" or "10" which allows the scan asynchronous memory element 10 to hold a current state, and the value "L" represents a bit pattern "11" which allows the scan asynchronous memory element 10 to hold a scan input. The SC1, SC2 are alternately changed to "H" and "L" to scan in a test pattern applied to the scan input SI, and the pair of L1 and L2 latches holds "t2" and "t1." Description of the L2L1 shift is omitted, but basically, operation of the L2L1 shift can be described with the SC1, SC2 in the L1L2 shift being interchanged.

Figure 10:
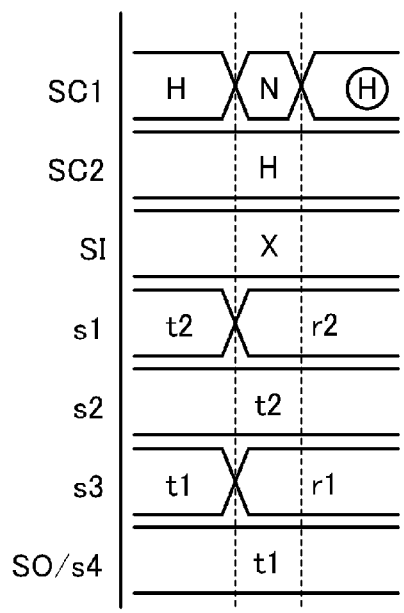
FIG. 10 is a timing diagram of L1 capture.

FIG. 10 is timing diagram of the L1 capture. The value "N" of the SC1 illustrated in the figure represents a bit pattern "00" when the A, B are input from the combinational circuit 20 to the scan asynchronous memory element 10. When the SC1 is changed from "N" to "H" with the SC2 being "H," the L1 latch captures response patterns "r2" and "r1" of the combinational circuit 20. Description of the L2 capture is omitted, but basically, operation of the L2 capture is described with the SC1, SC2 of the L1 capture being interchanged.

When the response patterns of the combinational circuit 20 are captured in the L1 or L2 capture, or after the test pattern is scanned in and before the response patterns of the combinational circuit 20 are captured in the L1L2 or L2L1 shift, the SC1 or the SC2 transitions to "H" ("H" circled in FIG. 9 and FIG. 10), but if the bit pattern is not suitable, a race occurs in the scan asynchronous memory element 10. For example, when the asynchronous memory element 12 is a C-element, and the scan asynchronous memory element 10 holds the response pattern "01" of the combinational circuit 20 due to the SC1 set to "00," the SC1 is set to "10," which changes the inputs (a, b) of the asynchronous memory element 12 from "01" to "10" in the scan asynchronous memory element 10. Here, in some cases, the inputs (a, b) change to "00" or "11" depending on timing at which the inputs (a, b) change, which may change a hold value of the scan asynchronous memory element 10. Thus, when the response pattern of the combinational circuit 20 is "01," the scan asynchronous memory element 10 has to be controlled by setting the SC1 to "01."

When the asynchronous memory element 12 is a D latch in which the input (a) is a data input, and the input (b) is a strobe pulse input (where in Table 5, the inputs (a, b) are "00" when the SC is "01," and the inputs (a, b) are "10" when the SC is "10"), and the scan asynchronous memory element 10 holds the response pattern "01" of the combinational circuit 20 due to the SC1 set to "00," the SC1 is set to "10," which changes the inputs (a, b) of the asynchronous memory element 12 from "01" to "10" in the scan asynchronous memory element 10. Here, in some cases, the inputs (a, b) change to "11" depending on timing at which the inputs (a, b) change, which may change the hold value of the scan asynchronous memory element 10. Thus, when the response pattern of the combinational circuit 20 is "01," the scan asynchronous memory element 10 has to be controlled by setting the SC1 to "01."

That is, the bit pattern of the SC1 relating to holding operation of the scan asynchronous memory element 10 has to be determined based on the expected response pattern of the combinational circuit 20. The same applies to the SC2.

Figure 11:
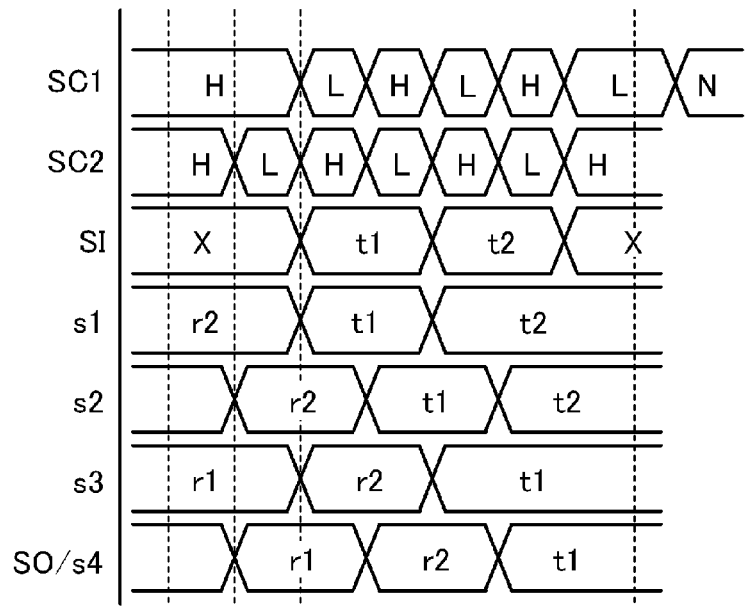
FIG. 11 is another timing diagram of the L1L2 shift.

Note that as illustrated in FIG. 11, after the test pattern is scanned in and before the response pattern of the combinational circuit 20 is captured in the L1L2 shift, the SC1 is set to "L," thereby eliminating restriction on an immediately preceding bit pattern "H." This is because when the SC1 is changed to "L" before the response pattern of the combinational circuit 20 is captured, an output of an L2 latch in a preceding stage is scanned in the L1 latch, and the L1 latch remains holding a current state, so that the hold value is not changed due to the race. Since the SC1 changes from "L" to "N," that is, from "11" to "00," attention has to be paid to that the same effect as that produced by controlling the scan asynchronous memory element 10 by "H" is produced if the SC1 is temporarily "01" or "10" on the course of the change. The same applies to the L2L1 shift.

In view of the foregoing, the test pattern of the combinational circuit 20 can be generated according to the following procedure. Note that the test pattern can be generated by allowing a computer to execute the following procedure. First, by using an automatic test pattern generator (ATPG), or the like, a basic test pattern to be applied to the combinational circuit 20 is generated. Then, an expected response pattern of the combinational circuit 20 to the basic test pattern is computed by simulation. When the expected response pattern is obtained, bit patterns of the SC1, SC2 relating to holding operation of the scan asynchronous memory element 10 at timing at which the race occurs are then determined based on the value of the expected response pattern. Then, the bit patterns of the SC1, SC2 are added to the basic test pattern generated by the ATPG to obtain a final test pattern. Note that in the case of the L1L2* single latch design, basic test patterns are each generated for the partial circuits 21, 22, and expected response patterns have to be computed.

In order to detect all faults in the combinational circuit 20, the hold value of each scan asynchronous memory element 10 at the time when the test pattern has been scanned in has to be a value based on the response pattern of the combinational circuit 20 (see, Table 8, Table 9, and Table 10). Thus, it is preferable that a capture pattern be generated based on an expected response pattern computed by fault simulation, etc., where the capture pattern is generated so that when the basic test pattern is applied to the combinational circuit 20, a response pattern which includes an error to be detected is detected without losing the error, and that the capture pattern be used as a part of the test pattern.

<Testing Scan Asynchronous Memory Element>

Next, testing the scan asynchronous memory element 10 will be described. The asynchronous memory element 12 included in the scan asynchronous memory element 10 is used as a memory element of the combinational circuit 20 in normal operation, and is used as a latch in test operation. Thus, a suitable test pattern is applied to the SI of the asynchronous memory element scan chain 100 of FIG. 5, the applied test pattern is shifted to output an SO, and the output SO is verified, so that it is possible to test a storage function of the scan asynchronous memory element 10. Moreover, modifying the test pattern allows the storage function to be completely tested.

Let a, b denote the signal inputs of the scan asynchronous memory element 10, and c denote the output of the scan asynchronous memory element 10, states which the a, b, c can take differ depending whether the asynchronous memory element 12 is a C-element, a D latch, or an SR latch, but state transitions can be categorized according to the following three types. The first type represents a state transition in which a current state is held. The second type represents a state transition in which a hold value is flushed to a current state. The third type represents a state transition in which the hold value is changed.

For example, when the asynchronous memory element 12 is a C-element, (a, b, c) are any one of the following six states: (0, 0, 0), (1, 0, 0), (0, 1, 0), (1, 1, 1), (0, 1, 1), and (1, 0, 1). The first type includes the following four state transitions: (0, 0, 0) to (0, 1, 0), (0, 0, 0) to (1, 0, 0), (1, 1, 1) to (0, 1, 1), and (1, 1, 1) to (1, 0, 1). The second type includes the following four state transitions: (0, 1, 0) to (0, 0, 0), (1, 0, 0) to (0, 0, 0), (0, 1, 1) to (1, 1, 1), and (1, 0, 1) to (1, 1, 1). The third type includes the four state transitions: (0, 1, 0) to (1, 1, 1), (1, 0, 0) to (1, 1, 1), (0, 1, 1) to (0, 0, 0), and (1, 0, 1) to (0, 0, 0). Thus, the scan input and the bit patterns of the SC1, SC2 are determined so that all of these three types of state transitions are reproduced for the scan asynchronous memory element 10 which is tested, and test patterns are generated. The storage function of the scan asynchronous memory element 10 can be completely tested by using the thus generated test patterns.

Figure 12:
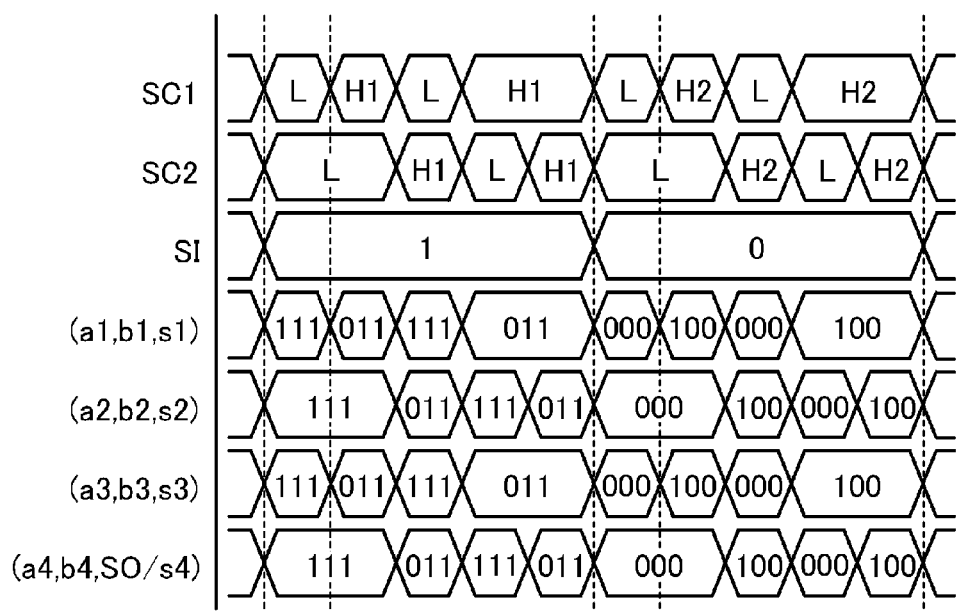
FIG. 12 is a timing diagram according to a test performed on the asynchronous memory element scan chain of FIG. 5.

FIG. 12 is a timing diagram according to a test of the asynchronous memory element scan chain 100 when the asynchronous memory element 12 is a C-element. The values "H1" and "H2" of the SC1, SC2 in the figure respectively represent a bit pattern "01" and a bit pattern "10" which allows the scan asynchronous memory element 10 to hold a current state. First, the SI is set to "1" to alternately change the SC1, SC2 to "L" and "H1," so that the state of each scan asynchronous memory element 10 repeats the following transition: (1, 1, 1) to (0, 1, 1) to (1, 1, 1), and the first and second types of the state transition are reproduced. Next, the SI is changed to "0," so that the third type of the state transition is reproduced in each scan asynchronous memory element 10. Then, the SC1, SC2 are alternately changed to "L" and "H2," so that the state of each scan asynchronous memory element 10 repeats the following transition: (0, 0, 0) to (1, 0, 0) to (0, 0, 0), which reproduces the first and second types of the state transition. Normal operation of each scan asynchronous memory element 10 is determined by evaluating the SO scanned out from the scan asynchronous memory element 10 in a final stage.

Note that an example in which the synchronous memory element 12 is a D latch or an SR latch is omitted. However, scan asynchronous memory elements 10 can be tested basically by the method described above, where only the states which (a, b, c) can take, and the state transition corresponding to the first to third types are different from those described in the case where the asynchronous memory element 12 is a C-element.

<Generation of Test Pattern of Semiconductor Integrated Circuit>

A test pattern for the combinational circuit 20 included in the semiconductor integrated circuit after step 4 of FIG. 6B is basically generated in a manner as described below. Note that the test pattern can be generated by allowing a computer to execute the following procedure. First, scan asynchronous memory elements 10 are removed from a semiconductor integrated circuit to form a circuit model in which a combinational circuit 20 is divided into partial circuits 21, 22 between which there is no input/output dependency. In the circuit model, outputs of the removed scan asynchronous memory elements 10 serve as pseudo primary inputs of the partial circuits 21, 22, and inputs of the removed scan asynchronous memory elements 10 serve as pseudo primary outputs of the partial circuits 21, 22 (see, the configuration of FIG. 13 except the components illustrated by broken lines). Next, for each of the partial circuits 21, 22 of the circuit model, an individual test pattern for each of faults is generated by using an ATPG, etc. so that there is no logical inconsistency between a test pattern and a response pattern. Note that in order to propagate a fault value to the scan asynchronous memory element 10 which captures the response pattern, it is sufficient that a test pattern for input portions of a pseudo output cone whose apex is the scan asynchronous memory element 10 is applied to the partial circuits 21, 22. Thus, only minimum input portions are used as the test pattern.

In general, the ATPG does not generate a different test pattern for each fault, but generates a test pattern by which a plurality of faults can be detected simultaneously. Specifically, when a test pattern for a fault is generated, random values are supplied to inputs which are unnecessary for detection of the fault, thereby performing fault simulation. As a result, if it is found that another fault can be detected simultaneously, a newly generated test pattern is used, thereby omitting generation of a test pattern for the another fault. The combinational circuit 20 can be efficiently and completely tested by using a test pattern generated under such conditions. However, in the L1 L2* single latch design, there may be logical inconsistency between a latch for holding a test pattern and a latch for holding a response pattern which are paired as an LSSD latch. That is, in the L1L2* single latch design, it is not ensured that in response to a given test pattern by which a plurality of faults can be detected, any desired response pattern can be captured.

Figure 13:
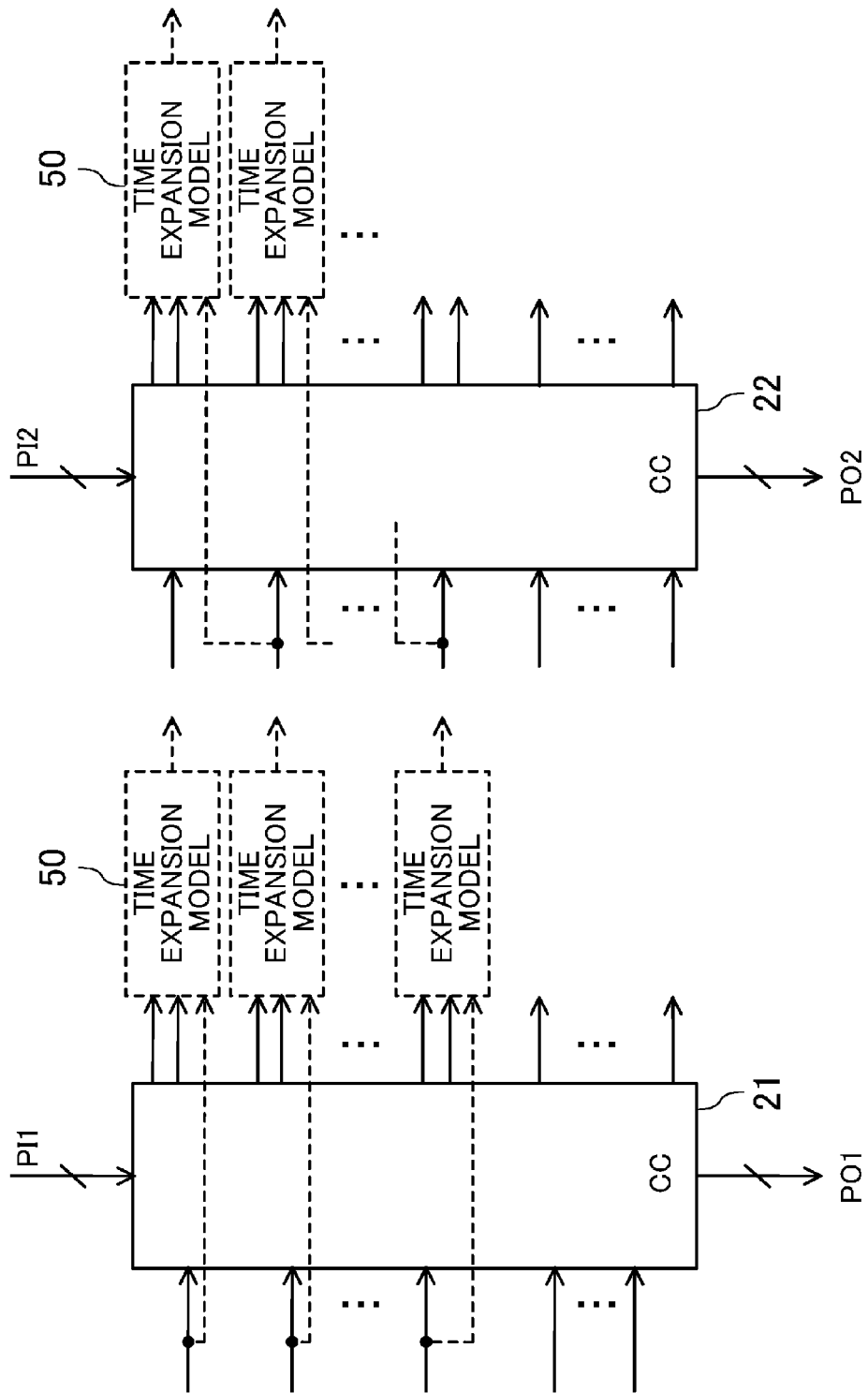
FIG. 13 is a view schematically illustrating a circuit model temporarily formed in generating a test pattern.

Thus, the test pattern may be generated by the method described below. First, as illustrated in FIG. 13, a circuit model in which there is no input/output dependency between partial circuits 21, 22 is formed. Specifically, scan asynchronous memory elements 10 included in an asynchronous circuit are replaced with time expansion models 50. Each time expansion model is obtained through time expansion of the asynchronous memory element 12 included in the scan asynchronous memory element 10, and receives a signal input of the partial circuit 21 or 22 which corresponds to a signal input of the scan asynchronous memory element 10 and an output of a scan asynchronous memory element 10 of a succeeding stage. Moreover, the signal inputs of the partial circuits 21, 22 are replaced with primary inputs, and an output of each time expansion model 50 is replaced with an primary output. The circuit model of FIG. 13 is thus formed.

Note that when the semiconductor integrated circuit includes a transparent scan latch 30, the transparent scan latch 30 may be omitted in the circuit model, and the signal inputs of the partial circuits 21, 22 corresponding to an output of the omitted transparent scan latch 30 may be replaced with primary inputs, and signal outputs of the partial circuits 21, 22 corresponding to inputs of the omitted transparent scan latch 30 may be replaced with primary outputs.

Figure 14:
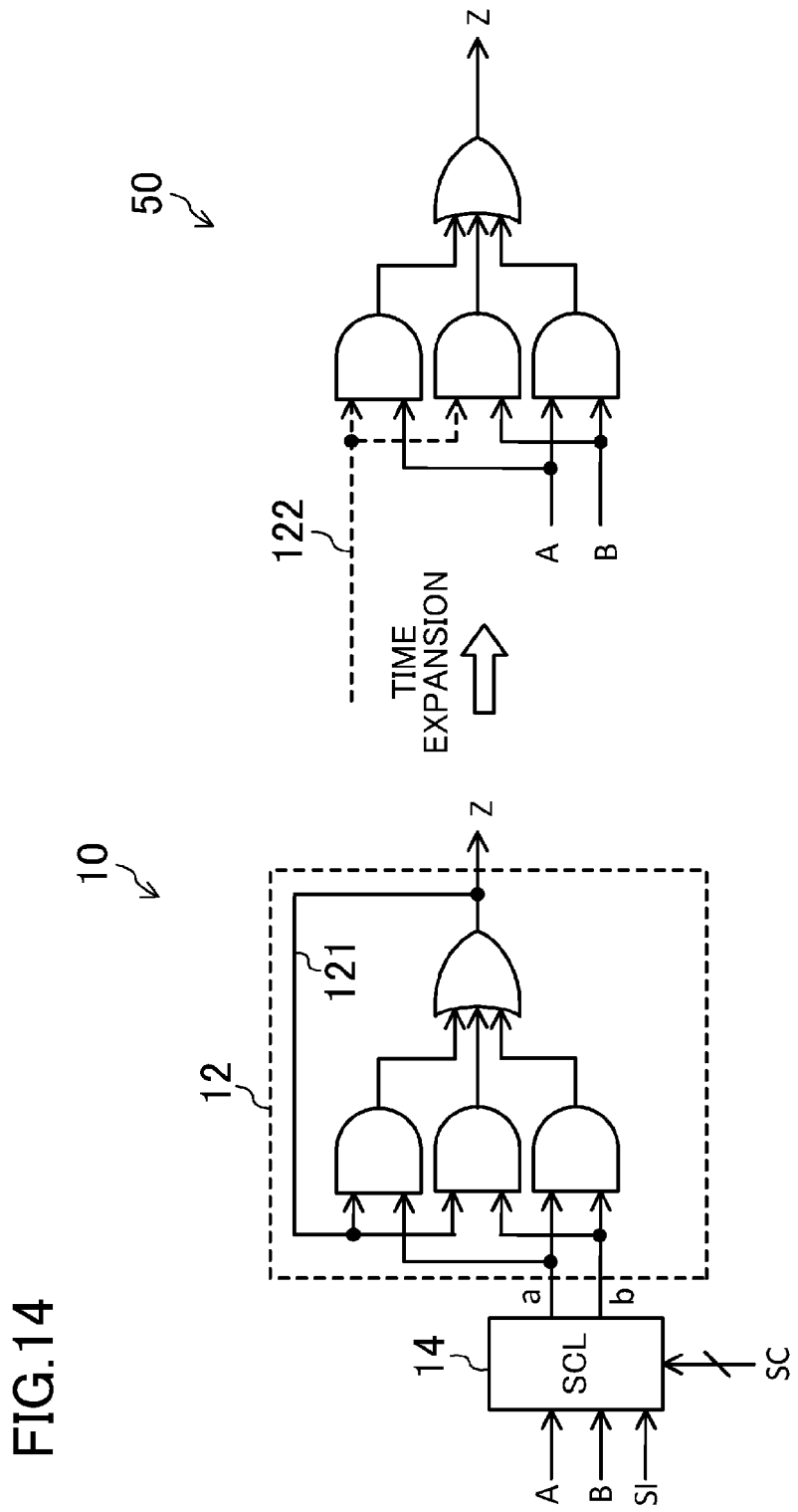
FIG. 14 is a view illustrating a time expansion model corresponding to a scan asynchronous memory element including an asynchronous memory element which is a C-element.

FIG. 14 illustrates a time expansion model 50 corresponding to the scan asynchronous memory element 10 including the asynchronous memory element 12 which is a C-element. For example, when the asynchronous memory element 12 is a C-element as illustrated on the left side in FIG. 14, the scan control logic circuit 14 is omitted, and the feedback path 121 of the output Z is cut, and as illustrated on the right side in FIG. 14, the input signal 122 of the partial circuit 21 or 22 which corresponds to the output of the scan asynchronous memory element 10 of the succeeding stage is connected, thereby forming a combinational circuit, which corresponds to the time expansion model 50.

Figure 15:
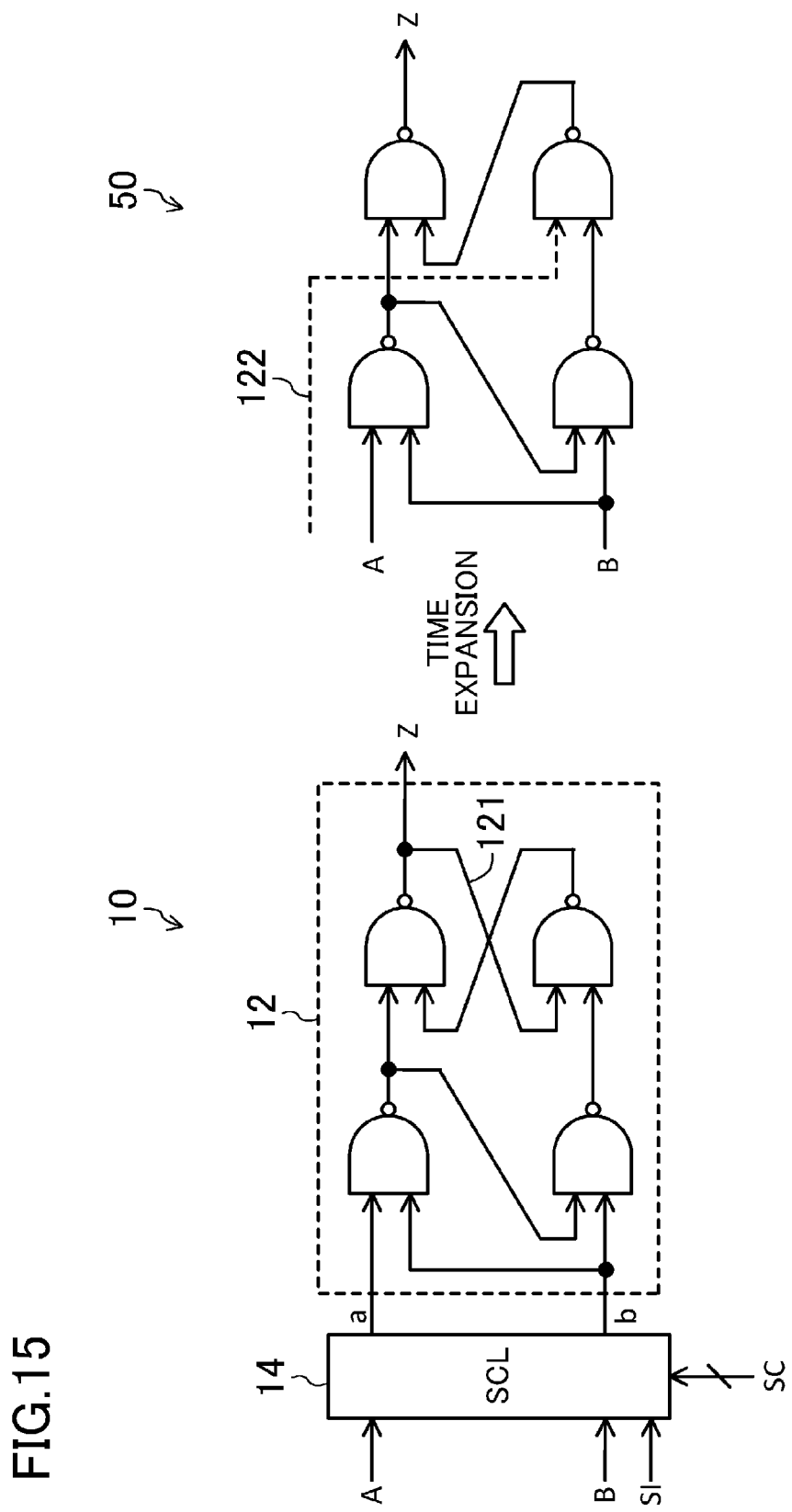
FIG. 15 is a view illustrating a time expansion model corresponding to a scan asynchronous memory element including an asynchronous memory element which is a D latch.

FIG. 15 illustrates a time expansion model 50 corresponding to the scan asynchronous memory element 10 including the asynchronous memory element 12 which is a D latch. For example, when the asynchronous memory element 12 is a D latch as illustrated on the left side in FIG. 15, the scan control logic circuit 14 is omitted, and the feedback path 121 of the output Z is cut, and as illustrated on the right side in FIG. 15, the input signal 122 of the partial circuit 21 or 22 which corresponds to the output of a scan asynchronous memory element 10 of the succeeding stage is connected, thereby forming a combinational circuit, which corresponds to the time expansion model 50.

Figure 16:
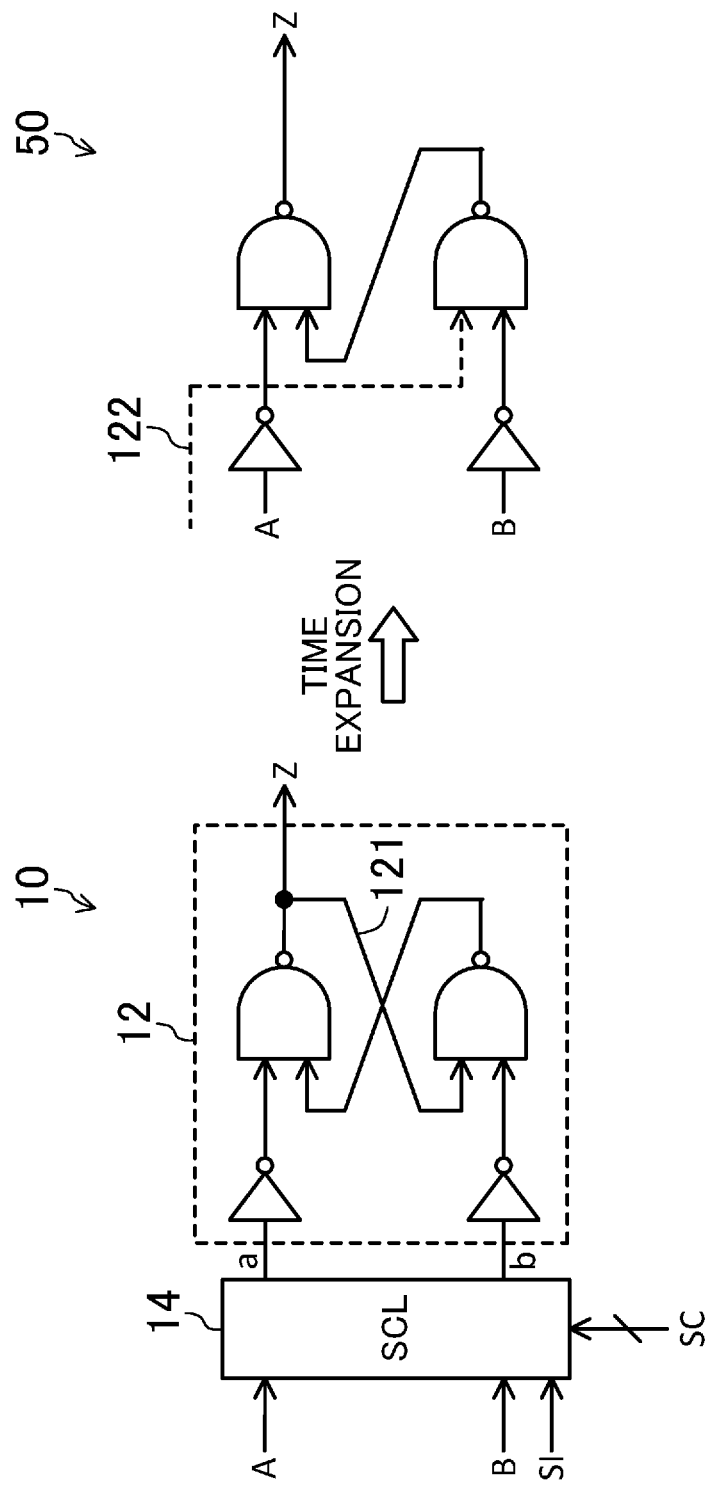
FIG. 16 is a view illustrating a time expansion model corresponding to a scan asynchronous memory element including an asynchronous memory element which is a positive logic SR latch.

FIG. 16 illustrates a time expansion model 50 corresponding to the scan asynchronous memory element 10 including the asynchronous memory element 12 which is a positive logic SR latch. For example, when the asynchronous memory element 12 is a positive logic SR latch as illustrated on the left side in FIG. 16, the scan control logic circuit 14 is omitted, and the feedback path 121 of the output Z is cut, and as illustrated on the right side in FIG. 16, the input signal 122 of the partial circuit 21 or 22 which corresponds to the output of the scan asynchronous memory element 10 of the succeeding stage is connected, thereby forming a combinational circuit, which corresponds to the time expansion model 50.

As described above, the asynchronous memory element 12 in each model is modified into a combinational circuit through time expansion. In particular, a C-element is modified into a combinational circuit realizing a majority function through time expansion.

The circuit model is thus formed, and then a test pattern by which a plurality of faults can be detected simultaneously is generated for each of the partial circuits 21, 22 of the circuit model.

The output of the time expansion model 50 is restricted by the output of the scan asynchronous memory element 10 of the succeeding stage in which the output of the replaced scan asynchronous memory element 10 is scanned. Thus, a test pattern causing logical inconsistency between a latch for holding the test pattern and a latch for holding the response pattern which are paired as an LSSD is no longer generated. That is, a test pattern generated for the circuit model ensures the logical consistency between the latch for holding the test pattern and the latch for holding the response pattern which are paired as the LSSD. Thus, compared to asynchronous circuits having L1L2* single latch design, a test pattern by which a plurality of faults can be detected simultaneously can be scanned in without logical inconsistency.

Note that the generation of the test pattern is applicable to a conventional asynchronous circuit having the L1 L2* single latch design without scan asynchronous memory elements 10. In the conventional asynchronous circuit, asynchronous memory elements included in the original asynchronous circuit, and sections including multiplexers and latches inserted in a feedback path of the original asynchronous circuit may be replaced with time expansion models 50.

Various embodiments have been described above as example techniques of the present disclosure, in which the attached drawings and the detailed description are provided.

As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential.

Since the embodiments described above are intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

What is claimed is:

1. A scan asynchronous memory element comprising:
an asynchronous memory element configured to receive an n-input, where n is an integer greater than or equal to 2; and
a scan control logic circuit configured to generate the n-input to the asynchronous memory element from an n-bit signal input and a scan input according to a control signal supplied to the scan control logic circuit, wherein
as the n input to the asynchronous memory element,
the scan control logic circuit outputs the n-bit signal input when the control signal has a first bit pattern, the scan control logic circuit outputs the scan input when the control signal has a second bit pattern, and the scan control logic circuit outputs a bit pattern allowing the asynchronous memory element to hold a current state when the control signal has a bit pattern other than the first and second bit patterns, wherein the asynchronous memory element includes a Muller's C-element, and the control signal includes an n-bit signal, and the scan control logic circuit includes a combinational logic circuit configured to output the control signal when the control signal has a pattern other than the first and second bit patterns, and output the scan input as an n-bit scan input when the control signal has the second bit pattern, and n multiplexers each configured to receive a bit pair of the signal input and an output of the combinational logic circuit, and output, as each input to the asynchronous memory element, the signal input when the control signal has the first bit pattern, and the output of the combinational logic circuit when the control signal has a pattern other than the first bit pattern.

2. The scan asynchronous memory element of claim 1, wherein the asynchronous memory element includes an asymmetric C-element.

3. The scan asynchronous memory element of claim 1, wherein the asynchronous memory element includes a latch.

4. A semiconductor integrated circuit comprising:

a combinational circuit; and the scan asynchronous memory element of claim 1 including a plurality of scan asynchronous memory elements, wherein the signal inputs and outputs of the plurality of scan asynchronous memory elements are connected to the combinational circuit, and the plurality of scan asynchronous memory elements are cascade-connected such that an output of a preceding stage is connected to a scan input of a succeeding stage.

5. A method for generating by a computer a test pattern to test the combinational circuit included in the semiconductor integrated circuit of claim 4, the method comprising:

generating a basic test pattern to be applied to the combinational circuit;

computing an expected response pattern which is an expected value of a response pattern of the combinational circuit to the basic test pattern; and determining, based on the expected response pattern, a bit pattern of the control signal as part of the test pattern, where in capturing the response pattern of the combinational circuit to the basic test pattern, the bit pattern of the control signal is used for holding operation of the scan asynchronous memory element which captures the response pattern.

6. The method of claim 5, further comprising:

generating, based on the expected response pattern, a capture pattern as part of the test pattern, where in applying the basic test pattern to the combinational circuit, the capture pattern is used to capture a response pattern including an error caused by a fault to be detected by the basic test pattern without losing the error.

7. The method of claim 5, further comprising:

determining, based on the expected response pattern, a bit pattern of the control signal as part of the test pattern, where after the basic test pattern is scanned in the plurality of scan asynchronous memory elements, and before a response pattern of the combinational circuit to the basic test pattern is captured, the bit pattern of the control signal is used for holding operation of the scan asynchronous memory element which captures the response pattern of the combinational circuit.

8. A method for generating by a computer a test pattern to test the scan asynchronous memory element included in the semiconductor integrated circuit of claim 4, the method comprising:

determining a scan input of the scan asynchronous memory element to be tested and a bit pattern of the control signal such that a first state transition in which the scan asynchronous memory element to be tested holds a current state, a second state transition in which a hold value is flushed to the current state, and a third state transition in which the hold value changes are all reproduced.

9. A semiconductor integrated circuit comprising:

a combinational circuit; and a plurality of scan asynchronous memory elements, wherein each scan asynchronous memory elements comprises:

an asynchronous memory element configured to receive an n-input, where n is an integer greater than or equal to 2; and a scan control logic circuit configured to generate the n-input to the asynchronous memory element from an n-bit signal input and a scan input according to a control signal supplied to the scan control logic circuit, wherein as the n input to the asynchronous memory element, the scan control logic circuit outputs the n-bit signal input when the control signal has a first bit pattern, the scan control logic circuit outputs the scan input when the control signal has a second bit pattern, and the scan control logic circuit outputs a bit pattern allowing the asynchronous memory element to hold a current state when the control signal has a bit pattern other than the first and second bit patterns, wherein:

the signal inputs and outputs of the plurality of scan asynchronous memory elements are connected to the combinational circuit, and the plurality of scan asynchronous memory elements are cascade-connected such that an output of a preceding stage is connected to a scan input of a succeeding stage, the combinational circuit includes first and second partial circuits, where an output of one of the first and second partial circuits is input, via the scan asynchronous memory elements, to the other of the first and second partial circuits, the scan asynchronous memory elements of odd-numbered stages are commonly controlled by a first control signal, signal inputs to the scan asynchronous memory elements of the odd-numbered stages are connected to the first partial circuit, and outputs of the scan asynchronous memory elements of the odd-numbered stages are connected to the second partial circuit, and the scan asynchronous memory elements of even-numbered stages are commonly controlled by a second control signal, signal inputs to the scan asynchronous memory elements of the even-numbered stages are connected to the second partial circuit, and outputs of the scan asynchronous memory elements of the even-numbered stages are connected to the first partial circuit.

10. A method for designing by a computer the semiconductor integrated circuit of claim 9, the method comprising:

replacing asynchronous memory elements included in an original asynchronous circuit with the scan asynchronous memory elements;

grouping the scan asynchronous memory elements into first and second latches, and dividing a combinational circuit included in the original asynchronous circuit into the first and second partial circuits;

determining input/output dependency between the first and second latches; and alternately connecting the first and second latches between which there is no input/output dependency, and connecting the output of the preceding stage to the scan input of the succeeding stage.

11. The method of claim 10, wherein the dividing the combinational circuit includes inserting a transparent scan latch between the first and second partial circuits if the scan asynchronous memory elements alone do not completely divide the combinational circuit of the original asynchronous circuit into the first and second partial circuits, the transparent scan latch configured to operate based on a control signal commonly with the scan asynchronous memory elements, output the signal input when the control signal has the first bit pattern, output the scan input when the control signal has the second bit pattern, and hold a current state when the control signal has a bit pattern other than the first and second bit patterns.

12. The method of claim 10, wherein the connecting the first and second latches includes, if a pair of first and second latches between which there is no input/output dependency is not found, inserting a scan latch as a counterpart of the first or second latch, the scan latch configured to operate based on a control signal commonly with the scan asynchronous memory elements, output the scan input when the control signal has the second bit pattern, and hold a current state when the control signal has a bit pattern other than the first and second bit patterns.

13. A method for generating by a computer a test pattern to test the combinational circuit included in the semiconductor integrated circuit of claim 9, the method comprising:

forming a circuit model in which the plurality of scan asynchronous memory elements are replaced with time expansion models each of which is obtained through time expansion of the asynchronous memory element included in the scan asynchronous memory element, and receives a signal input of the combinational circuit which corresponds to the signal input of the scan asynchronous memory element of the preceding stage and an output of the scan asynchronous memory element of the succeeding stage, signal inputs of the first and second partial circuits are replaced with primary inputs, and outputs of the time expansion models are replaced with primary outputs; and generating test patterns for the first and second partial circuits of the circuit model.

\* \* \* \* \*